(12) United States Patent
Hiramatsu

(10) Patent No.: US 12,087,794 B2
(45) Date of Patent: Sep. 10, 2024

(54) SOLID-STATE IMAGING DEVICE, SOLID-STATE IMAGING DEVICE MANUFACTURING METHOD, AND ELECTRONIC DEVICE

(71) Applicant: SONY SEMICONDUCTOR SOLUTIONS CORPORATION, Kanagawa (JP)

(72) Inventor: Katsunori Hiramatsu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 680 days.

(21) Appl. No.: 17/283,164

(22) PCT Filed: Oct. 15, 2019

(86) PCT No.: PCT/JP2019/040472
§ 371 (c)(1),
(2) Date: Apr. 6, 2021

(87) PCT Pub. No.: WO2020/080356
PCT Pub. Date: Apr. 23, 2020

(65) Prior Publication Data
US 2021/0343774 A1    Nov. 4, 2021

(30) Foreign Application Priority Data

Oct. 17, 2018 (JP) .................................. 2018-195679

(51) Int. Cl.
*H01L 27/146* (2006.01)
(52) U.S. Cl.
CPC .. *H01L 27/14634* (2013.01); *H01L 27/14636* (2013.01); *H01L 27/14683* (2013.01)

(58) Field of Classification Search
CPC ................................................ H01L 27/14634
See application file for complete search history.

(56) References Cited

U.S. PATENT DOCUMENTS

2006/0094151 A1   5/2006  Sumi
2007/0246756 A1*  10/2007 Mouli ............... H01L 27/14603
                                                              257/292
(Continued)

FOREIGN PATENT DOCUMENTS

CN     104681572 A    6/2015
JP     2005353996 A  12/2005
(Continued)

OTHER PUBLICATIONS

International Search Report prepared by the Japan Patent Office on Dec. 13, 2019, for International Application No. PCT/JP2019/040472.

*Primary Examiner* — Douglas M Menz
(74) *Attorney, Agent, or Firm* — SHERIDAN ROSS P.C.

(57) ABSTRACT

Provided is a solid-state imaging device capable of further improving reliability of a solid-state imaging device and further reducing manufacturing cost. Provided is a solid-state imaging device including a second semiconductor substrate provided with a photoelectric conversion unit and a second element, a second insulating layer, a first semiconductor substrate provided with a first element, and a first insulating layer arranged in this order from a light incident side, and including a groove formed on the first semiconductor substrate, in which the groove has a first side wall and a second side wall, and a part of at least one side wall of the first side wall or the second side wall extends in an oblique direction with respect to a surface of the first semiconductor substrate on the light incident side.

8 Claims, 12 Drawing Sheets

(56) References Cited

U.S. PATENT DOCUMENTS

| | | |
|---|---|---|
| 2010/0225774 A1 | 9/2010 | Enomoto et al. |
| 2012/0056288 A1 | 3/2012 | Yoshihara et al. |
| 2012/0211849 A1 | 8/2012 | Matsugai |
| 2012/0217604 A1 | 8/2012 | Shibuki |

FOREIGN PATENT DOCUMENTS

| | | |
|---|---|---|
| JP | 2006-128392 | 5/2006 |
| JP | 2010-212307 | 9/2010 |
| JP | 2012-054450 | 3/2012 |
| JP | 2012-174937 | 9/2012 |
| JP | 2018-081946 | 5/2018 |
| JP | 2018078305 A | 5/2018 |
| JP | 2018-117102 | 7/2018 |
| JP | 2018-129374 | 8/2018 |
| WO | WO-2018135194 A1 | 7/2018 |
| WO | WO-2018146984 A1 | 8/2018 |

\* cited by examiner

SOLID-STATE IMAGING DEVICE, SOLID-STATE IMAGING DEVICE MANUFACTURING METHOD, AND ELECTRONIC DEVICE

CROSS REFERENCE TO RELATED APPLICATIONS

This application is a national stage application under 35 U.S.C. 371 and claims the benefit of PCT Application No. PCT/JP2019/040472 having an international filing date of 15 Oct. 2019, which designated the United States, which PCT application claimed the benefit of Japanese Patent Application No. 2018-195679, filed 17 Oct. 2018, the entire disclosures of each of which are incorporated herein by reference.

TECHNICAL FIELD

The present technology relates to a solid-state imaging device, a solid-state imaging device manufacturing method, and an electronic device.

BACKGROUND ART

In general, solid-state imaging devices such as complementary metal oxide semiconductor (CMOS) image sensors and charge coupled devices (CCDs) are widely used in digital still cameras, digital video cameras, and the like.

In manufacturing a solid-state imaging device, there is a technology of using a silicon on insulator (SOI) in order to prevent variations in the film thickness of a semiconductor substrate. However, if a silicon on insulator (SOI) substrate is used, there is a possibility that the manufacturing cost of the solid-state imaging device increases.

For example, a technology has been proposed in which a solid-state imaging device can be manufactured at low cost without using a silicon on insulator (SOI) substrate (see Patent Documents 1 and 2).

CITATION LIST

Patent Document

Patent Document 1: Japanese Patent Application Laid-Open No. 2005-353996
Patent Document 2: Japanese Patent Application Laid-Open No. 2008-182142

SUMMARY OF THE INVENTION

Problems to be Solved by the Invention

However, the technologies proposed in Patent Documents 1 and 2 may not be able to further improve the reliability of the solid-state imaging device, in the present technology. Furthermore, if a silicon on insulator (SOI) substrate is used in the present technology, there is a possibility that the manufacturing cost of the solid-state imaging device increases.

Therefore, the present technology has been made in view of such a situation, and has a main purpose to provide a solid-state imaging device capable of further improving reliability of the solid-state imaging device and further reducing the manufacturing cost, a solid-state imaging device manufacturing method, and an electronic device equipped with the solid-state imaging device.

Solutions to Problems

As a result of diligent research to solve the above-mentioned object, the present inventors have succeeded in further improving the reliability of the solid-state imaging device and further reducing the manufacturing cost, and have completed the present technology.

That is, in the present technology,
provided is a solid-state imaging device including a second semiconductor substrate provided with a photoelectric conversion unit and a second element, a second insulating layer, a first semiconductor substrate provided with a first element, and a first insulating layer arranged in this order from a light incident side, and
including a groove formed on the first semiconductor substrate,
in which the groove has a first side wall and a second side wall, and a part of at least one side wall of the first side wall or the second side wall extends in an oblique direction with respect to a surface of the first semiconductor substrate on the light incident side.

In the solid-state imaging device according to the present technology, the groove may be embedded with an insulating material.

In the solid-state imaging device according to the present technology, the groove may have a second width and a first width that are substantially parallel to the surface of the first semiconductor substrate on the light incident side in order from the light incident side, and the second width may be larger than the first width.

In the solid-state imaging device according to the present technology, the groove may be formed in a region through which a through via connecting the second element and the first element penetrates.

In the solid-state imaging device according to the present technology, the groove may be formed in an element separation region.

In the solid-state imaging device according to the present technology, the groove may be formed in a peripheral region outside a pixel region.

In the solid-state imaging device according to the present technology, the groove may be formed in a scribe region.

The solid-state imaging device according to the present technology may further include a bonding assisting film, and the bonding assisting film may be arranged between the second insulating layer and the groove.

Furthermore, in the present technology,
provided is a solid-state imaging device manufacturing method including:
forming a groove on one surface of a first semiconductor substrate;
stacking a second semiconductor substrate, a second insulating layer, the first semiconductor substrate, and a first insulating layer in this order so that the one surface of the first semiconductor substrate and the second insulating layer face each other; and
removing the first semiconductor substrate until the groove is exposed from another surface of the first semiconductor substrate on a side opposite to the one surface of the first semiconductor substrate,
in which the forming of the groove is forming so that the groove forms a first side wall and a second side wall and a part of at least one side wall of the first side wall or the second side wall extends in an oblique direction with respect to the one surface of the first semiconductor substrate.

The solid-state imaging device manufacturing method according to the present technology may further include embedding an insulating material in the groove before the stacking.

Moreover, in the present technology, provided is an electronic device equipped with a solid-state imaging device, the solid-state imaging device including a second semiconductor substrate provided with a photoelectric conversion unit and a second element, a second insulating layer, a first semiconductor substrate provided with a first element, and a first insulating layer arranged in this order from a light incident side, and including a groove formed on a side of a surface of the first semiconductor substrate on the light incident side, in which the groove has a first side wall and a second side wall, and a part of at least one side wall of the first side wall or the second side wall extends in an oblique direction with respect to the surface of the first semiconductor substrate on the light incident side.

According to the present technology, it is possible to further improve reliability of a solid-state imaging device and further reduce manufacturing cost. Note that the effects described herein are not necessarily limited, and any of the effects described in the present disclosure may be applied.

MODE FOR CARRYING OUT THE INVENTION

Figure 1:
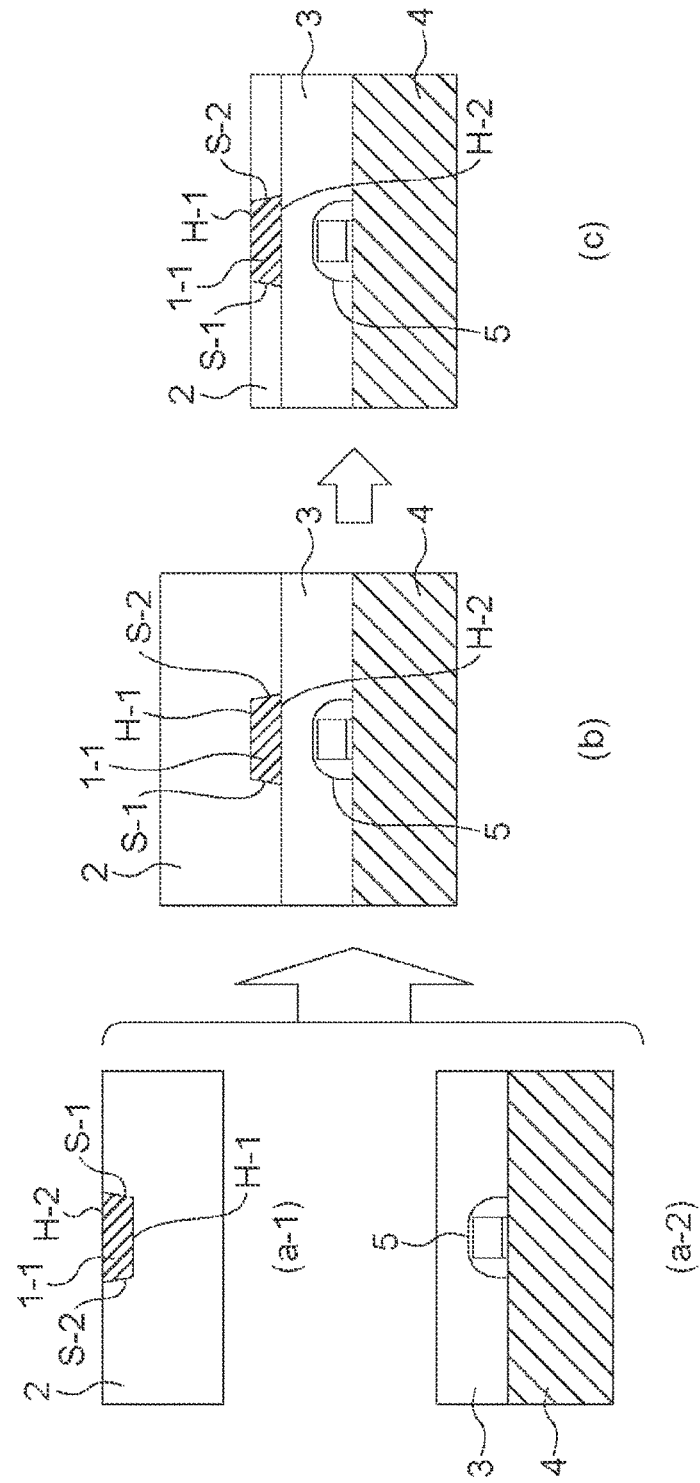
FIG. 1 is a cross-sectional view for explaining a solid-state imaging device manufacturing method to which the present technology is applied.

Hereinafter, preferred embodiments for carrying out the present technology will be described. The embodiments described below are examples of typical embodiments of the present technology, and the scope of the present technology should not be construed narrowly. Note that, unless otherwise specified, in the drawings, "upper" means an upper direction or an upper side in the drawing, "lower" means a lower direction or a lower side in the drawing, "left" means a left direction or a left side in the drawing, and "right" means a right direction or a right side in the drawing. Furthermore, in the drawings, the same or equivalent elements or members are designated by the same reference numerals, and duplicate description will be omitted.

The description will be given in the following order.
1. Outline of the present technology
2. First embodiment (first example of solid-state imaging device)
3. Second embodiment (second example of solid-state imaging device)
4. Third embodiment (third example of solid-state imaging device)
5. Fourth embodiment (fourth example of solid-state imaging device)
6. Fifth embodiment (first example of solid-state imaging device manufacturing method)
7. Sixth embodiment (example of electronic device)
8. Use example of solid-state imaging device to which the present technology is applied
9. Application example to endoscopic surgery system 1. Outline of the Present Technology First, an outline of the present technology will be described.

In manufacturing of a solid-state imaging device having a stacked transistor (Tr) structure, it is necessary to control a film thickness of a semiconductor substrate because device characteristics vary due to variations in the film thickness of the bonded semiconductor substrate (Si substrate). Therefore, a solid-state imaging device having a stacked transistor (Tr) structure is manufactured by using a silicon on insulator (SOI) substrate having a small variation in the film thickness of the semiconductor substrate.

However, in the solid-state imaging device manufacturing method using a silicon on insulator (SOI) substrate, the manufacturing cost is high in some cases because the substrate is expensive.

Figure 7:
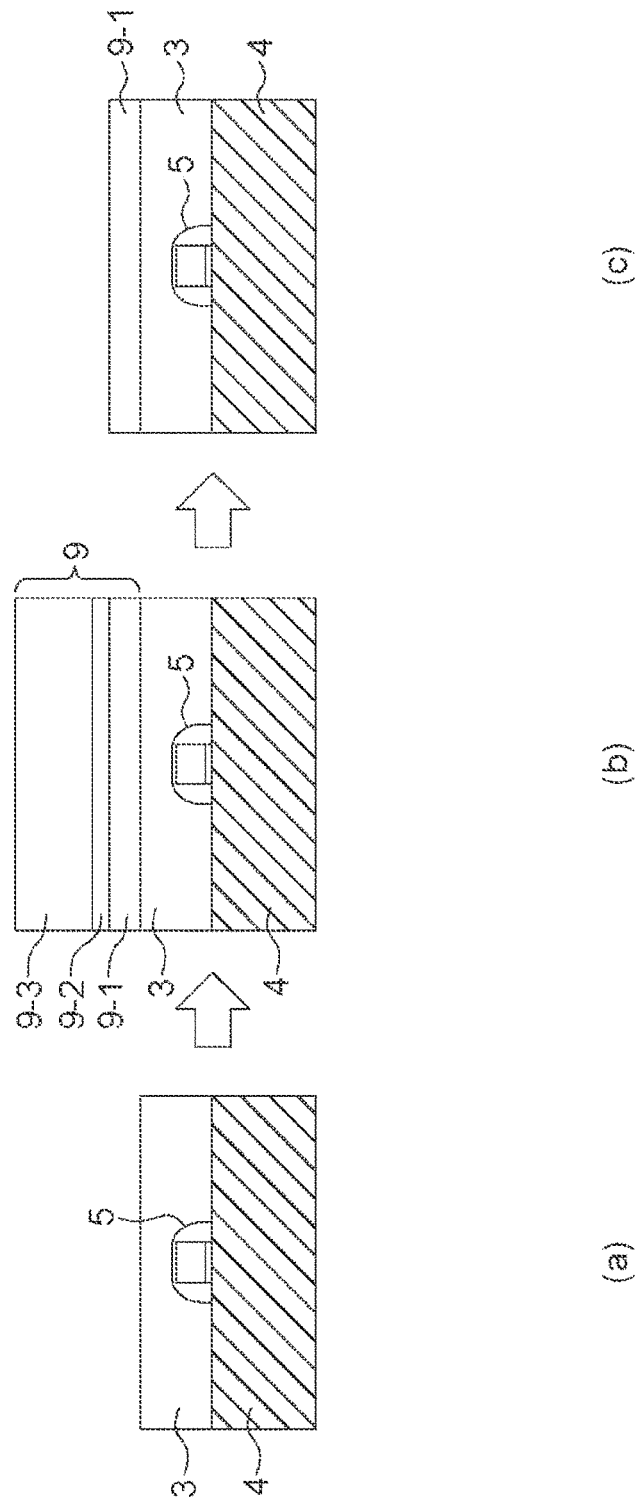
FIG. 7 is a cross-sectional view for explaining a solid-state imaging device manufacturing method.
Figure 8:
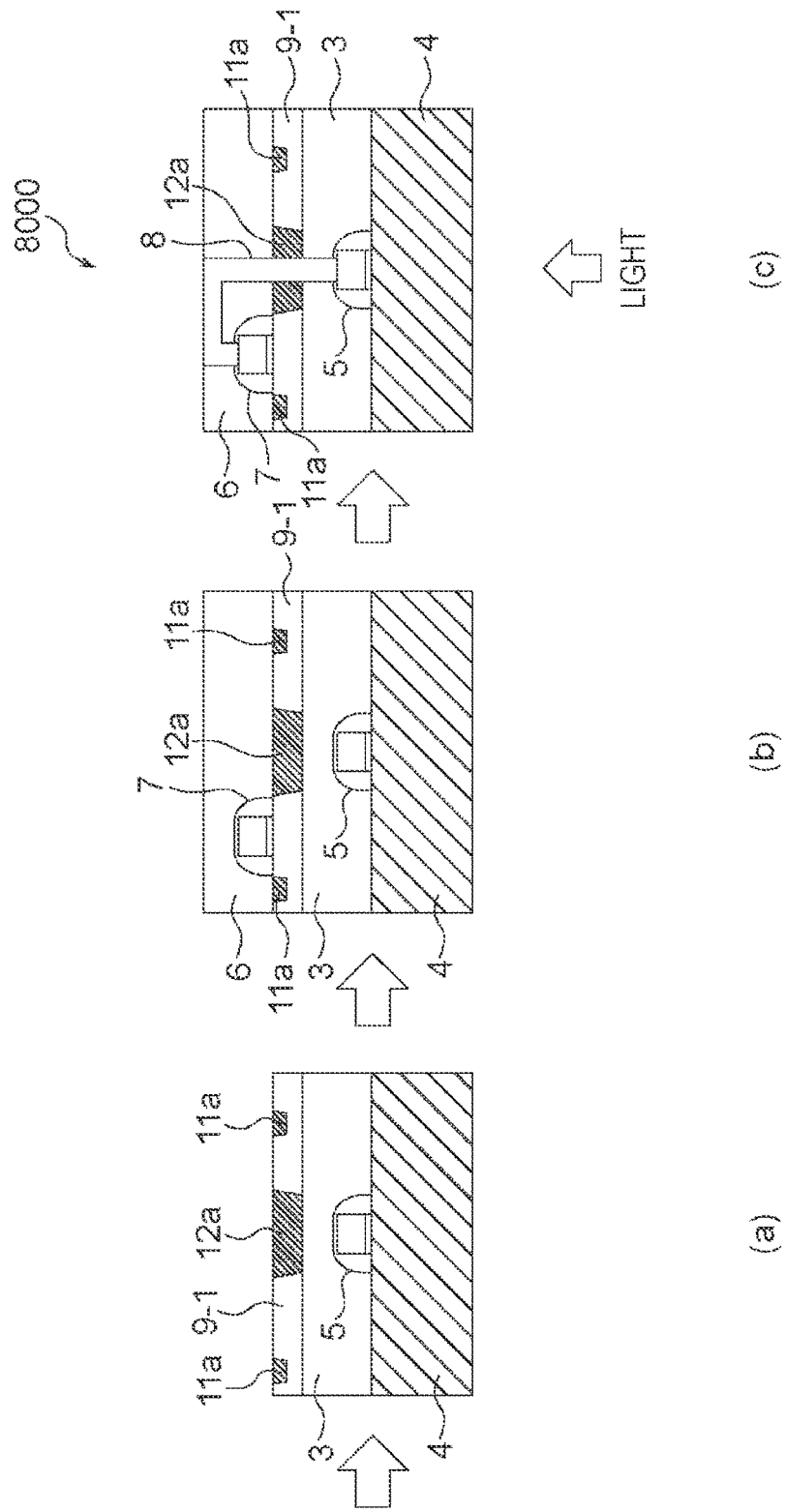
FIG. 8 is a cross-sectional view for explaining the solid-state imaging device manufacturing method, and a cross-sectional view showing a configuration example of the solid-state imaging device.

Hereinafter, a solid-state imaging device manufacturing method using a silicon on insulator (SOI) substrate will be described with reference to FIGS. 7 and 8. FIGS. 7(a) to 7(c) and 8(a) to 8(c) are cross-sectional views for explaining a manufacturing method of a solid-state imaging device using an SOI substrate.

As shown in FIG. 7(a), a second element 5 (for example, a transistor) is formed on a second semiconductor substrate 4, and a second insulating layer 3 (pre-metal dielectric (PMD) film) is formed on the second semiconductor substrate 4. Although not shown, a photodiode (PD, photoelectric conversion unit) is formed on the second semiconductor substrate 4.

In FIG. 7(b), an SOI substrate 9 in which a silicon layer 9-1 is formed on a silicon substrate 9-3 via an insulating layer (BOX layer) 9-2 is used to bond the SOI substrate 9 and the second semiconductor substrate 4 to each other via the second insulating layer 3 so that the silicon substrate 9-1 and the second insulating layer 3 face each other.

Subsequently, as shown in FIG. 7(c), the silicon substrate 9-3 and the insulating layer (BOX layer) 9-2 are removed.

Next, description will be given with reference to FIG. 8.

As shown in FIG. 8(a), in the left direction (left side in FIG. 2(a)) and the right direction (right side in FIG. 2(a)) of the silicon layer 9-1, silicon (Si) is removed to form an element separation region 11a including an insulating material, and further, silicon (Si) is removed to form a region 12a including an insulating material in a region in contact with the second semiconductor substrate 4 (second element 5) on the silicon layer 9-1.

Subsequently, as shown in FIG. 8(b), a first element 7 (for example, a transistor) is formed between the element separation region 11a and the region 12a in the left direction of the silicon layer 9-1 to form a first insulating layer 6 (pre-metal dielectric (PMD) film) on the silicon layer 9-1.

Finally, FIG. 8(c) shows that a solid-state imaging device 8000 has been manufactured. The solid-state imaging device 8000 is configured such that the second semiconductor substrate 4 provided with a photodiode (PD) (photoelectric conversion unit) (not shown) and the second element 5, the second insulating layer 3, the silicon layer 9-1 provided with the first element 7, and the first insulating layer 6 are stacked in this order from the light incident side (lower side in FIG. 8(c)). A through via 8 is passed through the region 12a, and the first element 7 and the second element 5 are connected via the through via 8.

The present technology has been made in view of the circumstances described above. A solid-state imaging device to which the present technology is applied includes a second semiconductor substrate provided with a photoelectric conversion unit and a second element, a second insulating layer, a first semiconductor substrate provided with a first element, and a first insulating layer arranged in this order from a light incident side, and includes a groove formed on the first semiconductor substrate, in which the groove has a first side wall and a second side wall, and a part of at least one side wall of the first side wall or the second side wall extends in an oblique direction with respect to a surface of the first semiconductor substrate on the light incident side. Furthermore, a solid-state imaging device manufacturing method to which the present technology is applied includes: forming a groove on one surface of a first semiconductor substrate; stacking a second semiconductor substrate, a second insulating layer, the first semiconductor substrate, and a first insulating layer in this order so that the one surface of the first semiconductor substrate and the second insulating layer face each other; and removing the first semiconductor substrate until the groove is exposed from another surface of the first semiconductor substrate on a side opposite to the one surface of the first semiconductor substrate, in which the forming of the groove is forming so that the groove forms a first side wall and a second side wall and a part of at least one side wall of the first side wall or the second side wall extends in an oblique direction with respect to the one surface of the first semiconductor substrate.

According to the present technology, it is possible to further improve reliability of a solid-state imaging device and reduce manufacturing cost. Specifically, according to the present technology, since a normal semiconductor substrate (bulk substrate) is used instead of using a silicon on insulator (SOI) substrate, the manufacturing cost can be reduced, and further, it is possible to use a groove that acts as an end point detection function at the time of thinning to control the film thickness of the semiconductor substrate with high accuracy to improve the device characteristics.

Hereinafter, embodiments relating to the present technology will be described in detail.

2. First Embodiment (First Example of Solid-State Imaging Device)

The solid-state imaging device of the first embodiment (first example of the solid-state imaging device) according to the present technology will be described.

A solid-state imaging device of the first embodiment (first example of the solid-state imaging device) according to the present technology includes a second semiconductor substrate provided with a photoelectric conversion unit (for example, photodiode (PD)) and a second element, a second insulating layer, a first semiconductor substrate provided with a first element, and a first insulating layer arranged in this order from a light incident side, and includes a groove formed on the first semiconductor substrate, in which the groove has a first side wall and a second side wall, and a part of at least one side wall of the first side wall or the second side wall extends in an oblique direction with respect to a surface of the first semiconductor substrate on the light incident side.

In addition, the groove of the solid-state imaging device of the first embodiment according to the present technology has a second width and a first width that are substantially parallel to the surface of the first semiconductor substrate on the light incident side in this order from the light incident side, the second width is larger than the first width, and the groove is formed in a region through which a through via connecting the second element and the first element penetrates.

The groove of the solid-state imaging device of the first embodiment according to the present technology may be embedded with any material, for example, an inorganic material, an organic material, or a polymer material, but it is preferable that the groove is embedded with an insulating material.

Examples of the insulating material include silicon oxide-based materials ($SiO_2$ and the like) and silicon nitride-based materials ($Si_3N_4$ and the like).

According to the solid-state imaging device of the first embodiment according to the present technology, since a normal semiconductor substrate (bulk substrate) is used instead of using a silicon on insulator (SOI) substrate, the manufacturing cost can be reduced, and further, it is possible to use the groove described above that acts as an end point detection function at the time of thinning to control the film thickness of the semiconductor substrate with high accuracy to improve the device characteristics.

Figure 2:
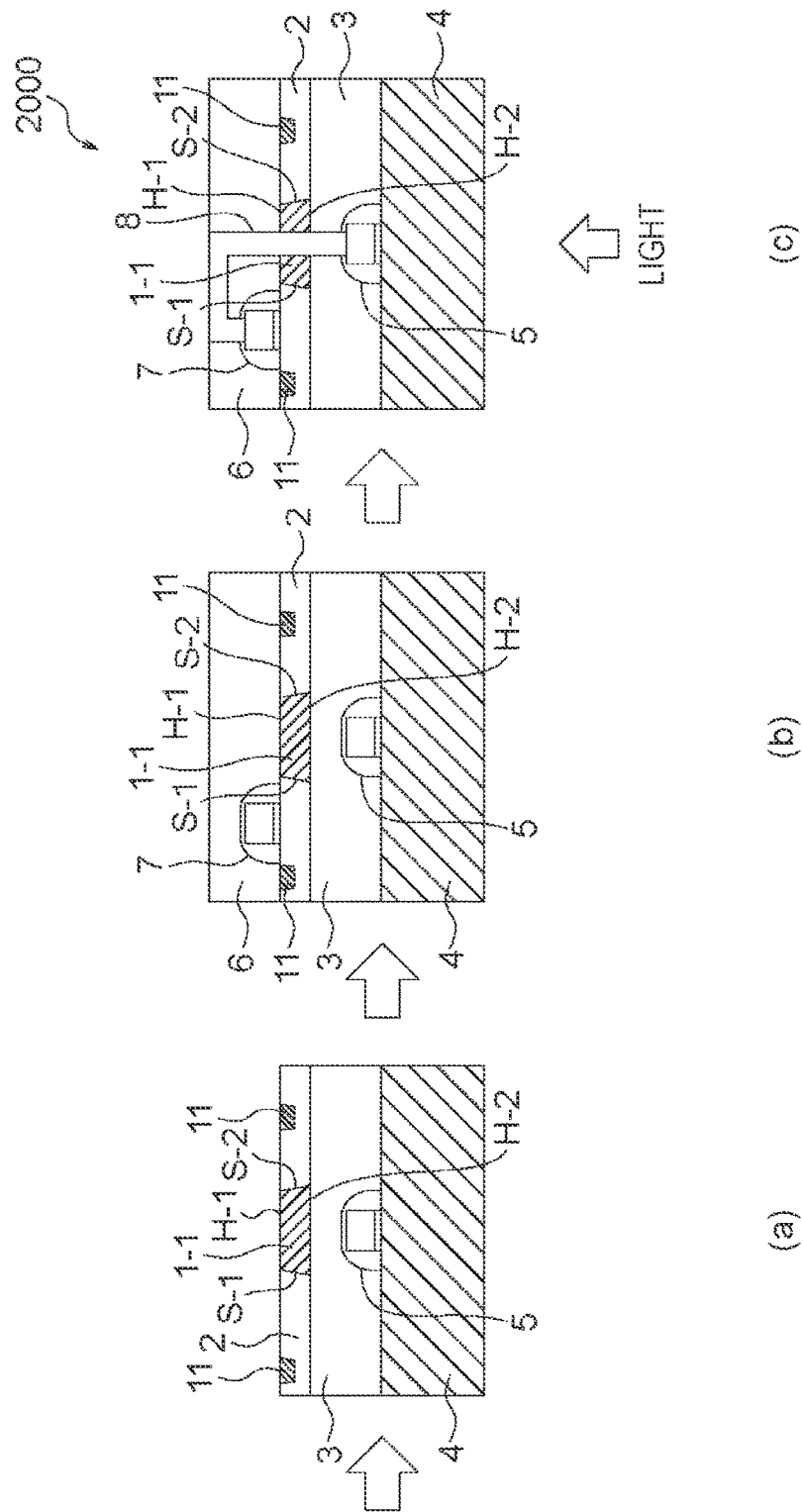
FIG. 2 is a cross-sectional view for explaining the solid-state imaging device manufacturing method to which the present technology is applied, and a cross-sectional view showing a configuration example of the solid-state imaging device to which the present technology is applied.

Hereinafter, the solid-state imaging device of the first embodiment according to the present technology will be described in more detail with reference to FIGS. 1, 2, 3(a) and 5. FIGS. 1 and 2 are cross-sectional views for explaining the solid-state imaging device manufacturing method to which the present technology is applied, and showing a configuration example of the solid-state imaging device to which the present technology is applied. Specifically, FIGS. 1(a) to 1(c) and FIGS. 2(a) to 2(c) are cross-sectional views for explaining a manufacturing method of the solid-state imaging device of the first embodiment according to the present technology, and FIG. 2(c) is a cross-sectional view of the solid-state imaging device 2000, which is the solid-state imaging device of the first embodiment according to the present technology.

Figure 3:
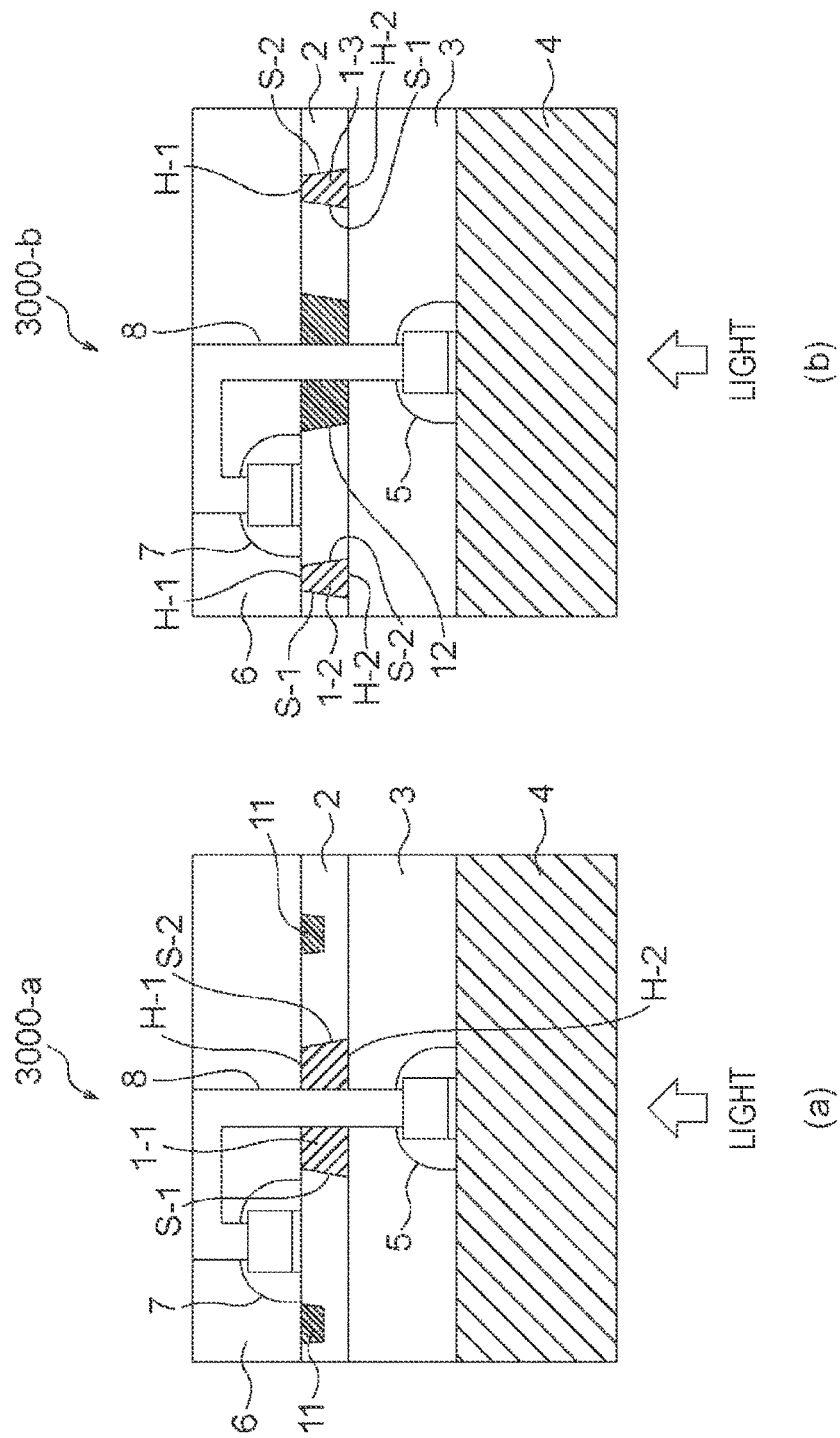
FIG. 3 is a cross-sectional view showing a configuration example of a solid-state imaging device to which the present technology is applied.

FIG. 3(a) is a cross-sectional view showing a configuration example of a solid-state imaging device to which the present technology is applied, and specifically, FIG. 3(a) is a cross-sectional view of a solid-state imaging device 3000-a which is a solid-state imaging device of the first embodiment according to the present technology.

Figure 5:
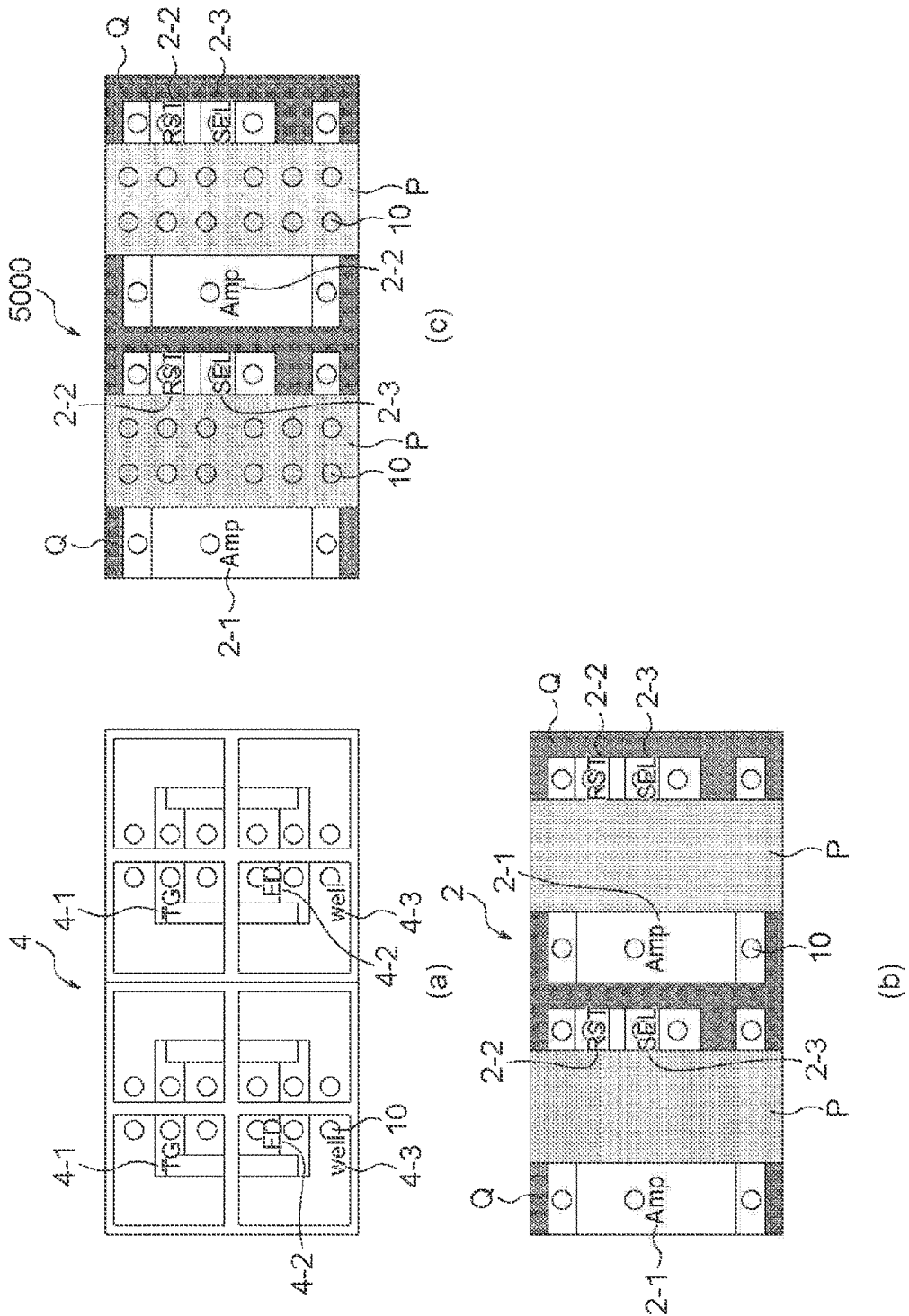
FIG. 5 is a top view showing a configuration example of a solid-state imaging device to which the present technology is applied.

FIG. 5 is a top view showing a configuration example of a solid-state imaging device to which the present technology is applied. Specifically, FIG. 5(a) is a top view of the second semiconductor substrate 4 viewed from a direction opposite to the light incident side (plan layout view of the second semiconductor substrate 4), FIG. 5(b) is a top view of the first semiconductor substrate 2 as viewed from the direction opposite to the light incident side (plan layout view of the first semiconductor substrate 2), and FIG. 5(c) is a top view of the solid-state imaging device 6000 in which the first semiconductor substrate 2 and the second semiconductor substrate 4 are stacked, as viewed from the direction opposite to the light incident side (plan layout view of the solid-state imaging device 6000).

First, the solid-state imaging device of the first embodiment according to the present technology will be described while explaining the manufacturing method of the solid-state imaging device of the first embodiment according to the present technology with reference to FIGS. 1 and 2. Note that the solid-state imaging device manufacturing method to which the present technology is applied will be described later in detail in the column of <6. Fifth embodiment (first example of the solid-state imaging device manufacturing method)> below.

As shown in FIG. 1(a-1), for example, a groove 1-1 (sometimes referred to as a trench) in which an insulating material is embedded is formed on the upper surface of the first semiconductor substrate 2 (upper side of FIG. 1(a-1)). The groove 1-1 has a right side wall S-2 (which is on the left side in FIG. 1(a-1)) and is the left side wall, and so on) and a left side wall S-1 (which is on the right side in FIG. 1(a-2) and is the right side wall, and so on), and further has an upper side H-2 (upper side of FIG. 1(a-1)) and a lower side H-1 (lower side of FIG. 1(a-1)). The groove 1-1 has a tapered shape in which the length of the upper side H-2 is longer than the length of the lower side H-1. The length of H-2 is a length in a direction substantially parallel to the upper surface of the first semiconductor substrate 2, and is a left-right length (width) in FIG. 1(a-1). As similar to this, the length of H-1 is also a length in a direction substantially parallel to the upper surface of the first semiconductor substrate 2, and is a left-right length (width) in FIG. 1(a-1). In addition, the right side wall S-2 and the left side wall S-1 extend in a lower direction (lower side of FIG. 1(a-1)) and in an oblique direction with respect to the upper surface of the first semiconductor substrate 2.

As shown in FIG. 1(a-2), a second element 5 (for example, a transistor) is formed on a second semiconductor substrate 4, and a second insulating layer 3 (pre-metal dielectric (PMD) film) is formed on the second semiconductor substrate 4. Although not shown, a photodiode (PD, photoelectric conversion unit) is formed on the second semiconductor substrate 4.

As shown in FIG. 1(b), the first semiconductor substrate 2 shown in FIG. 1(a-1) is rotated (turned over) by 180 degrees to bond the first semiconductor substrate 2 (upper layer substrate) and second semiconductor substrate 4 (lower layer substrate) to each other via the second insulating layer 3 so that the surface of the first semiconductor substrate 2 on which the groove 1-1 has been formed and the surface of the second insulating layer 3 face each other. As shown in FIG. 1(b), since the first semiconductor substrate 2 is rotated (turned over) by 180 degrees as described above, the groove 1-1 has an inverted tapered shape. That is, the groove 1-1 has the left side wall S-1 (left side of FIG. 1(b)), the right side wall S-2 (right side of FIG. 1(b)), the upper side H-1 (upper side of FIG. 1(b)), and the lower side H-2 (lower side of FIG. 1(b)), and the length of the lower side H-2 is longer than the length of the upper side H-1.

As shown in FIG. 1(c), the first semiconductor substrate 2 (upper layer substrate) is removed until the groove 1-1 is exposed from the upper surface (upper side in FIG. 1(b)) of the first semiconductor substrate 2 (upper layer substrate) shown in FIG. 1(b), and the first semiconductor substrate 2 (upper layer substrate) is thinly processed. The groove 1-1 has an end point detection function for stopping the processing in thinning. By forming the groove 1-1 on the first semiconductor substrate 2 (upper layer substrate), the film thickness of the first semiconductor substrate 2 (upper layer substrate) can be controlled with high accuracy.

This will be explained with reference to FIG. 2.

As shown in FIG. 2(a), the element separation region is formed in the left direction (left side in FIG. 2(a)) and the right direction (right side in FIG. 2(a)) of the first semiconductor substrate 2 (upper layer substrate).

In addition, as shown in FIG. 2(b), the first element 7 (for example, a transistor) is formed between the element separation region 11 in the left direction of the first semiconductor substrate 2 (upper layer substrate) and the groove 1-1, and the first insulating layer 6 (pre-metal dielectric film (PMD)) is formed on the first semiconductor substrate 2 (upper layer substrate).

Finally, FIG. 2(c) shows that the through via 8 is passed through the region of the groove 1-1, and the first element 7 and the second element 5 are connected via the through via 8 and the solid-state imaging device 2000 has been manufactured. That is, the groove 1-1 is formed in a through region where the through via 8 penetrates the first semiconductor substrate 2 (upper layer substrate), and the solid-state imaging device 2000 is manufactured. The solid-state imaging device 2000 is configured such that the second semiconductor substrate 4 (lower layer substrate) provided with a photodiode (photoelectric conversion unit) (not shown) and the second element 5, the second insulating layer 3, the first semiconductor substrate 2 provided with the first element 7, and the first insulating layer 6 are stacked in this order from the light incident side (lower side in FIG. 2(c)). As described above, the solid-state imaging device 2000 has the groove 1-1 formed on the first semiconductor substrate 2 (upper layer substrate), and also has two element separation regions 11. In the groove 1-1, for example, an insulating material is embedded, and the two element separation regions 11 include an insulating film and are formed in the left direction and the right direction of the first semiconductor substrate 2 (upper layer substrate).

As shown in FIG. 2(c), the groove 1-1 has the left side wall S-1 (left side of FIG. 2(c)), the right side wall S-2 (right side of FIG. 2(c)), the upper side H-1 (upper side of FIG. 1(b)), and the lower side H-2 (lower side of FIG. 1(b)). In addition, since the length of the lower side H-2 is longer than the length of the upper side H-1, the groove 1-1 has a reverse tapered shape. Note that, as described above, the groove 1-1 has an inverted tapered shape in FIG. 2(c), but the upper portion of the groove may not substantially coincide with the upper side H-1, and for example, may be an upward convex shape (upper side in FIG. 2(c)), and the lower portion of the groove may not substantially coincide with the lower side H-2, and, for example, may be a downward convex shape (lower side in FIG. 2(c)). As similar to this, in FIG. 2(c), the shape of the insulating material embedded in the groove 1-1 has a reverse tapered shape as similar to that of the groove 1-1, but the portion corresponding to the upper side H-1 of the shape of the insulating material may be raised in an upward convex shape (upper side in FIG. 2(c)), and the portion corresponding to the lower side H-2 in the shape of the insulating material may be raised in a downward convex shape (lower side in FIG. 2(c)).

The left side wall S-1 and the right side wall S-2 extend in an upward direction (upper side in FIG. 2(c)) and in an oblique direction with respect to the surface of the first semiconductor substrate 2 on the light incident side. The first element 7 is formed between the groove 1-1 and the element separation region 11 including the insulating film in the left direction, and when the groove 1-1 is embedded with an insulating material, the groove 1-1 may be formed in the element separation region and serve as the element separation function.

Note that, although not shown, in the solid-state imaging device 2000, for example, an on-chip lens for condensing light, a color filter (color filter for blue light, color filter for green light, color filter for red light, and the like) and the like may be provided in this order from the light incident side in the lower portion (lower side in FIG. 2(c)) of the second semiconductor substrate 4 (lower layer substrate).

Next, description will be given with reference to FIG. 3(a).

Since the solid-state imaging device 3000-a shown in FIG. 3(a) has the same configuration as the solid-state imaging device 2000 described above, detailed description of the solid-state imaging device 3000-a will be omitted. To briefly explain the solid-state imaging device 3000-a, the solid-state imaging device 3000-a is configured such that the second semiconductor substrate 4 (lower layer substrate) provided with the photodiode (PD) (photoelectric conversion unit) (not shown) and the second element 5, the second insulating layer 3, the first semiconductor substrate 2 provided with the first element 7, and the first insulating layer 6 are stacked in this order from the light incident side (lower side in FIG. 3(a)). Furthermore, the solid-state imaging device 3000-a has the groove 1-1 formed on the first semiconductor substrate 2 (upper layer substrate), and two element separation regions 11. In the groove 1-1, for example, an insulating material is embedded, and the two element separation regions 11 include an insulating film and are formed in the left direction and the right direction of the first semiconductor substrate 2 (upper layer substrate). The groove 1-1 included in the solid-state imaging device 3000-a also has an end point detection function for stopping the processing when the first semiconductor substrate 2 (upper layer substrate) is thinned. Also in the solid-state imaging device 3000-a, by forming the groove 1-1 on the first semiconductor substrate 2 (upper layer substrate), the film thickness of the first semiconductor substrate 2 (upper layer substrate) can be controlled with high accuracy.

This will be described with reference to FIG. 5.

As shown in FIG. 5(a), in the second semiconductor substrate 4 (lower layer substrate), a transfer gate (TG) 4-1 for reading charges from a photodiode (not shown), a floating diffusion (FD) 4-2, well region 4-3, through via 10 for contacting the first semiconductor substrate 2 (upper layer substrate), and the like are formed.

As shown in FIG. 5(b), in the first semiconductor substrate 2 (upper layer substrate), an AMP transistor 2-1, an RST transistor 2-2, an SEL transistor 2-3, the through via 10 for contacting the second semiconductor substrate 4 (lower layer substrate), and the like are formed. A P region of the first semiconductor substrate (upper layer substrate) shown in FIG. 5(b) is a region in which a contact is formed with the second semiconductor substrate (lower layer substrate) via the through via 10, and may have a groove having an end point detection function of the thinning when the first semiconductor substrate 2 (upper layer substrate) is thinned. Furthermore, a Q region of the first semiconductor substrate (upper layer substrate) shown in FIG. 5(b) is an element separation region formed in the first semiconductor substrate (upper layer substrate), and may have a groove having an end point detection function of the thinning when the first semiconductor substrate 2 (upper layer substrate) is thinned.

FIG. 5(c) shows a solid-state imaging device 5000. As shown in FIG. 5(c), the solid-state imaging device 5000 is a solid-state imaging device having a stacked transistor (Tr) structure in which the second semiconductor substrate 4 (lower layer substrate) shown in FIG. 5(a) and the first semiconductor substrate 2 (upper layer substrate) shown in FIG. 5(b) are stacked.

3. Second Embodiment (Second Example of Solid-State Imaging Device)

The solid-state imaging device of the second embodiment (second example of the solid-state imaging device) according to the present technology will be described.

A solid-state imaging device of the second embodiment (second example of the solid-state imaging device) according to the present technology includes a second semiconductor substrate provided with a photoelectric conversion unit and a second element, a second insulating layer, a first semiconductor substrate provided with a first element, and a first insulating layer arranged in this order from a light incident side, and includes a groove formed on the first semiconductor substrate, in which the groove has a first side wall and a second side wall, and a part of at least one side wall of the first side wall or the second side wall extends in an oblique direction with respect to a surface of the first semiconductor substrate on the light incident side.

In addition, the groove of the solid-state imaging device of the second embodiment according to the present technology has a second width and a first width that are substantially parallel to the surface of the first semiconductor substrate on the light incident side in this order from the light incident side, the second width is larger than the first width, and the groove is formed in an element separation region.

The groove of the solid-state imaging device of the second embodiment according to the present technology may be embedded with any material, for example, an inorganic material, an organic material, or a polymer material, but it is preferable that the groove is embedded with an insulating material.

Examples of the insulating material include silicon oxide-based materials ($SiO_2$ and the like) silicon nitride-based materials ($Si_3N_4$ and the like), and the like.

According to the solid-state imaging device of the second embodiment according to the present technology, since a normal semiconductor substrate (bulk substrate) is used instead of using a silicon on insulator (SOI) substrate, the manufacturing cost can be reduced, and further, it is possible to use the groove described above that acts as an end point detection function at the time of thinning to control the film thickness of the semiconductor substrate with high accuracy to improve the device characteristics.

Hereinafter, the solid-state imaging device of the second embodiment according to the present technology will be described in more detail with reference to FIG. 3(b). FIG. 3(b) is a diagram showing a configuration example of a solid-state imaging device to which the present technology is applied, and specifically, FIG. 3(b) is a cross-sectional view of a solid-state imaging device 3000-b which is a solid-state imaging device of the second embodiment according to the present technology.

As shown in FIG. 3(b), the solid-state imaging device 3000-b is configured such that the second semiconductor substrate 4 (lower layer substrate) provided with a photodiode (PD) (photoelectric conversion unit) (not shown) and the second element 5, the second insulating layer 3, the first semiconductor substrate 2 (upper layer substrate) provided with the first element 7, and the first insulating layer 6 are stacked in this order from the light incident side (lower side in FIG. 3(b)). Furthermore, the solid-state imaging device 3000-b has two grooves 1-2 and 1-3 formed on the first semiconductor substrate 2 (upper layer substrate). As shown in FIG. 3(b), the groove 1-2 is formed in an element separation region in the left direction (left direction in FIG. 3(b)) of the first semiconductor substrate 2 (upper layer substrate), and the groove 1-3 is formed in an element separation region in the right direction (right direction in FIG. 3(b)) of the first semiconductor substrate 2 (upper layer substrate). Insulating materials are embedded in the grooves 1-2 and 1-3, for example.

The grooves 1-2 and 1-3 have an end point detection function for stopping the processing in thinning the first semiconductor substrate 2 (upper layer substrate). Also in the solid-state imaging device 3000-b, by forming the grooves 1-2 and 1-3 on the first semiconductor substrate 2 (upper layer substrate), the film thickness of the first semiconductor substrate 2 (upper layer substrate) can be controlled with high accuracy. Furthermore, the grooves 1-2 and 1-3 are formed in the element separation region and also have an element separation function. Note that, in the solid-state imaging device 3000-b, either one of the grooves 1-2 and 1-3 may be formed.

Each of the grooves 1-2 and 1-3 has the left side wall S-1 (left side of FIG. 3(b)), the right side wall S-2 (right side of FIG. 3(b)), the upper side H-1 (upper side of FIG. 3(b)), and the lower side H-2 (lower side of FIG. 3(b)). In addition, since the length of the lower side H-2 is longer than the length of the upper side H-1, each of the grooves 1-2 and 1-3 has a reverse tapered shape. The left side wall S-1 and the right side wall S-2 extend in an upper direction (upper side in FIG. 3(b)) and in an oblique direction with respect to the surface of the first semiconductor substrate 2 on the light incident side. In FIG. 3(b), the first element 7 is formed between the groove 1-2 and a through part 12.

In the solid-state imaging device 3000-b, the through part 12 through which the through via 8 penetrates is formed including an insulating material. The through via 8 may be formed in the element separation region and also serve as an element separation function. Furthermore, the through part 12 may be a groove as an end point detection function. Although the through part 12 shown in FIG. 3(b) has a tapered shape, for example, from the viewpoint of manufacturing suitability for embedding an insulating material in the groove, it is preferable that the through part 12 has a reverse tapered shape.

Except for the above, for the solid-state imaging device of the second embodiment according to the present technology, the contents described in the solid-state imaging device of the first embodiment according to the present technology can be applied as they are, unless there is a technical contradiction.

4. Third Embodiment (Third Example of Solid-State Imaging Device)

The solid-state imaging device of the third embodiment (third example of the solid-state imaging device) according to the present technology will be described.

A solid-state imaging device of the third embodiment (third example of the solid-state imaging device) according to the present technology includes a second semiconductor substrate provided with a photoelectric conversion unit and a second element, a second insulating layer, a first semiconductor substrate provided with a first element, and a first insulating layer arranged in this order from a light incident side, and includes a groove formed on the first semiconductor substrate, in which the groove has a first side wall and a second side wall, and a part of at least one side wall of the first side wall or the second side wall extends in an oblique direction with respect to a surface of the first semiconductor substrate on the light incident side.

In addition, the groove of the solid-state imaging device of the third embodiment according to the present technology has a second width and a first width that are substantially parallel to the surface of the first semiconductor substrate on the light incident side in this order from the light incident side, the second width is larger than the first width, and the groove is formed in a peripheral region outside the pixel region. The groove provided in the solid-state imaging device of the third embodiment according to the present technology may be formed in a peripheral circuit region outside the pixel region, or may be formed in a scribe region (for example, a guard ring region).

The groove of the solid-state imaging device of the third embodiment according to the present technology may be embedded with any material, for example, an inorganic material, an organic material, or a polymer material, but it is preferable that the groove is embedded with an insulating material.

Examples of the insulating material include silicon oxide-based materials ($SiO_2$ and the like) and silicon nitride-based materials ($Si_3N_4$ and the like).

According to the solid-state imaging device of the third embodiment according to the present technology, since a normal semiconductor substrate (bulk substrate) is used instead of using a silicon on insulator (SOI) substrate, the manufacturing cost can be reduced, and further, it is possible to use the groove described above that acts as an end point detection function at the time of thinning to control the film thickness of the semiconductor substrate with high accuracy to improve the device characteristics.

Figure 4:
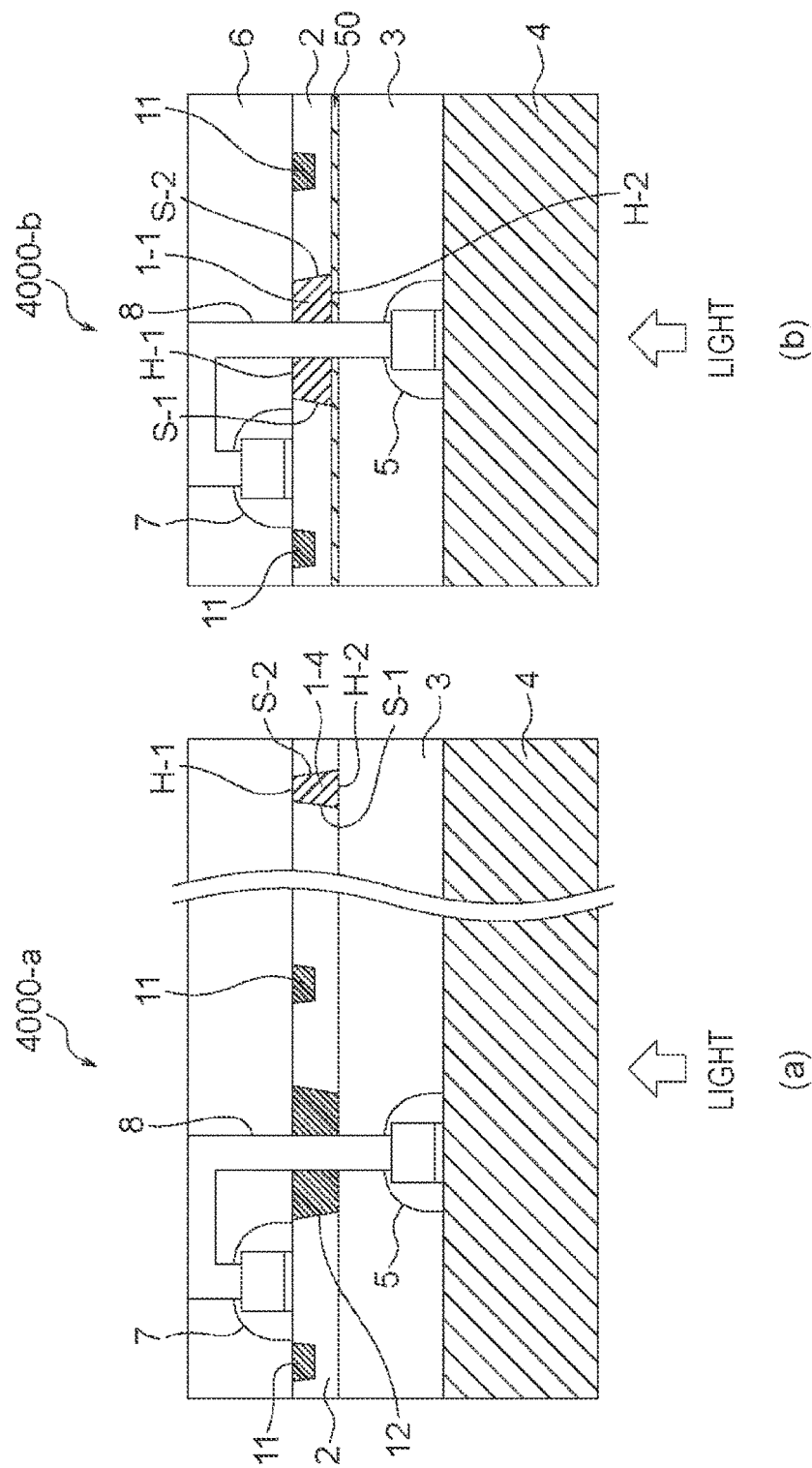
FIG. 4 is a cross-sectional view showing a configuration example of a solid-state imaging device to which the present technology is applied.

Hereinafter, the solid-state imaging device of the third embodiment according to the present technology will be described in more detail with reference to FIG. 4(a). FIG. 4(a) is a diagram showing a configuration example of a solid-state imaging device to which the present technology is applied, and specifically, FIG. 4(a) is a cross-sectional view of a solid-state imaging device 4000-a which is a solid-state imaging device of the third embodiment according to the present technology.

As shown in FIG. 4(a), the solid-state imaging device 4000-a is configured such that the second semiconductor substrate 4 (lower layer substrate) provided with a photodiode (PD) (photoelectric conversion unit) (not shown) and the second element 5, the second insulating layer 3, the first semiconductor substrate 2 (upper layer substrate) provided with the first element 7, and the first insulating layer 6 are stacked in this order from the light incident side (lower side in FIG. 4(a)). Furthermore, the solid-state imaging device 3000-b has a groove 1-4 formed on the first semiconductor substrate 2 (upper layer substrate). As shown in FIG. 4(a), the groove 1-4 is formed in a peripheral region outside the pixel region. The groove 1-4 may be formed in a peripheral circuit region outside the pixel region, or may be formed in a scribe region (for example, a guard ring region) as a dummy. An insulating material is embedded in the groove 1-4, for example.

The grooves 1-4 has an end point detection function for stopping the processing in thinning the first semiconductor substrate 2 (upper layer substrate). Also in the solid-state imaging device 4000-a, by forming the groove 1-4 on the first semiconductor substrate 2 (upper layer substrate), the film thickness of the first semiconductor substrate 2 (upper layer substrate) can be controlled with high accuracy.

The groove 1-4 has the left side wall S-1 (left side of FIG. 4(a)), the right side wall S-2 (right side of FIG. 4(a)), the upper side H-1 (upper side of FIG. 4(a)), and the lower side H-2 (lower side of FIG. 4(a)). In addition, since the length of the lower side H-2 is longer than the length of the upper side H-1, the groove 1-4 has a reverse tapered shape. The left side wall S-1 and the right side wall S-2 extend in an upper direction (upper side in FIG. 4(a)) and in an oblique direction with respect to the surface of the first semiconductor substrate 2 on the light incident side.

In addition, the solid-state imaging device 4000-a has two element separation regions 11. The two element separation regions 11 include an insulating film, and are formed in the left direction and the right direction of the first semiconductor substrate 2 (upper layer substrate). Furthermore, the solid-state imaging device 4000-a has the through part 12 through which the through via 8 penetrates, and the through part 12 is formed including an insulating material. In FIG. 4(a), the first element 7 is formed between the element separation region 11 in the left direction of the first semiconductor substrate 2 and the through part 12. The through via 8 may be formed in the element separation region and also serve as an element separation function. Furthermore, the through part 12 may be a groove as an end point detection function. Although the through part 12 shown in FIG. 4(b) has a tapered shape, for example, from the viewpoint of manufacturing suitability for embedding an insulating material in the groove, it is preferable that the through part 12 has a reverse tapered shape.

Except for the above, for the solid-state imaging device of the third embodiment according to the present technology, the contents described in the solid-state imaging device of the first embodiment according to the present technology can be applied as they are, unless there is a technical contradiction.

The solid-state imaging device of the first to third embodiments according to the present technology has been described above. In the solid-state imaging device according to the present technology, any of the groove 1-1 included in the solid-state imaging device of the first embodiment according to the present technology, the grooves 1-2 and 1-3 of the solid-state imaging device of the second embodiment according to the present technology, and groove 1-4 of the solid-state imaging device of the third embodiment according to the present technology may be used alone, or a plurality of grooves may be arbitrarily selected from the grooves 1-1, 1-2, 1-3 and 1-4, and may be used in any combination as appropriate.

5. Fourth Embodiment (Fourth Example of Solid-State Imaging Device)

The solid-state imaging device of the fourth embodiment (fourth example of the solid-state imaging device) according to the present technology will be described.

A solid-state imaging device of the fourth embodiment (fourth example of the solid-state imaging device) according to the present technology includes a second semiconductor substrate provided with a photoelectric conversion unit and a second element, a second insulating layer, a first semiconductor substrate provided with a first element, and a first insulating layer arranged in this order from a light incident side, and a groove formed on the first semiconductor substrate, in which the groove has a first side wall and a second side wall, and a part of at least one side wall of the first side wall or the second side wall extends in an oblique direction with respect to a surface of the first semiconductor substrate on the light incident side.

In addition, the solid-state imaging device of the fourth embodiment according to the present technology further has a bonding assisting film, and the bonding assisting film is arranged between the second insulating layer and the groove. Furthermore, the groove of the solid-state imaging device of the fourth embodiment according to the present technology has a second width and a first width that are substantially parallel to the surface of the first semiconductor substrate on the light incident side in this order from the light incident side, and the second width is larger than the first width. Moreover, the groove provided in the solid-state imaging device of the fourth embodiment according to the present technology may be formed in a region through which a through via connecting the second element and the first element penetrates, may be formed in an element separation region, or may be formed in a peripheral region outside the pixel region. In a case where the groove provided in the solid-state imaging device of the fourth embodiment according to the present technology is formed in a peripheral region outside the pixel region, the solid-state imaging device may be formed in a peripheral circuit region outside the pixel region or may be formed in a scribe region (for example, a guard ring region).

The groove of the solid-state imaging device of the fourth embodiment according to the present technology may be embedded with any material, for example, an inorganic material, an organic material, or a polymer material, but it is preferable that the groove is embedded with an insulating material.

Examples of the insulating material include silicon oxide-based materials ($SiO_2$ and the like) and silicon nitride-based materials ($Si_3N_4$ and the like).

According to the solid-state imaging device of the fourth embodiment according to the present technology, since a normal semiconductor substrate (bulk substrate) is used instead of using a silicon on insulator (SOI) substrate, the manufacturing cost can be reduced, and further, it is possible to use the groove described above that acts as an end point detection function at the time of thinning to control the film thickness of the semiconductor substrate with high accuracy to improve the device characteristics.

Hereinafter, the solid-state imaging device of the fourth embodiment according to the present technology will be described in more detail with reference to FIG. 4(b). FIG.

4(b) is a diagram showing a configuration example of a solid-state imaging device to which the present technology is applied, and specifically, FIG. 4(b) is a cross-sectional view of a solid-state imaging device 4000-b which is a solid-state imaging device of the fourth embodiment according to the present technology.

As shown in FIG. 4(b), the solid-state imaging device 4000-b is configured such that the second semiconductor substrate 4 (lower layer substrate) provided with a photodiode (PD) (photoelectric conversion unit) (not shown) and the second element 5, the second insulating layer 3, the first semiconductor substrate 2 (upper layer substrate) provided with the first element 7, and the first insulating layer 6 are stacked in this order from the light incident side (lower side in FIG. 4(b)). Furthermore, the solid-state imaging device 4000-b has a groove 1-1 formed on the first semiconductor substrate 2 (upper layer substrate). In addition, a bonding assisting film 50 is arranged between the second insulating layer 3 and the groove 1-1 (first semiconductor substrate 2). The bonding assisting film 50 functions as a film that assists the bonding between the first semiconductor substrate 2 (upper layer substrate) and the second semiconductor substrate 4 (lower layer substrate). As shown in FIG. 4(b), the groove 1-1 is formed in a through region where the through via 8 penetrates the first semiconductor substrate 2 (upper layer substrate), and for example, an insulating material is embedded in the groove 1-1. The solid-state imaging device 4000-b has two element separation regions 11. The two element separation regions 11 include an insulating film, and are formed in the left direction and the right direction of the first semiconductor substrate 2 (upper layer substrate).

The grooves 1-1 has an end point detection function for stopping the processing in thinning the first semiconductor substrate 2 (upper layer substrate). Also in the solid-state imaging device 4000-b, by forming the groove 1-1 on the first semiconductor substrate 2 (upper layer substrate), the film thickness of the first semiconductor substrate 2 (upper layer substrate) can be controlled with high accuracy.

The groove 1-1 has the left side wall S-1 (left side of FIG. 4(b)), the right side wall S-2 (right side of FIG. 4(b)), the upper side H-1 (upper side of FIG. 4(b)), and the lower side H-2 (lower side of FIG. 4(b)). In addition, since the length of the lower side H-2 is longer than the length of the upper side H-1, the groove 1-1 has a reverse tapered shape. The left side wall S-1 and the right side wall S-2 extend in an upper direction (upper side in FIG. 4(b)) and in an oblique direction with respect to the surface of the first semiconductor substrate 2 on the light incident side.

Except for the above, for the solid-state imaging device of the fourth embodiment according to the present technology, the contents described in the solid-state imaging device of the first to third embodiments according to the present technology can be applied as they are, unless there is a technical contradiction.

6. Fifth Embodiment (First Example of Solid-State Imaging Device Manufacturing Method)

Next, a solid-state imaging device manufacturing method of a fifth embodiment (first example of the solid-state imaging device manufacturing method) according to the present technology will be described.

A solid-state imaging device manufacturing method of the fifth embodiment (first example of solid-state imaging device manufacturing method) according to the present technology includes: forming a groove on one surface of a first semiconductor substrate; stacking a second semiconductor substrate, a second insulating layer, the first semiconductor substrate, and a first insulating layer in this order so that the one surface of the first semiconductor substrate and the second insulating layer face each other; and removing the first semiconductor substrate until the groove is exposed from another surface of the first semiconductor substrate on a side opposite to the one surface of the first semiconductor substrate, in which the forming of the groove is forming so that the groove forms a first side wall and a second side wall and a part of at least one side wall of the first side wall or the second side wall extends in an oblique direction with respect to the one surface of the first semiconductor substrate. The solid-state imaging device manufacturing method of the fifth embodiment (first example of the solid-state imaging device manufacturing method) according to the present technology may further include embedding an insulating material in the groove before stacking the second semiconductor substrate, the second insulating layer, the first semiconductor substrate, and the first insulating layer in this order so that the one surface of the first semiconductor substrate and the second insulating layer face each other. Examples of the insulating material include silicon oxide-based materials ($SiO_2$ and the like) and silicon nitride-based materials ($Si_3N_4$ and the like).

In addition, in the solid-state imaging device manufacturing method of the fifth embodiment according to the present technology, the forming of the groove may be forming a second width and a first width that are substantially parallel to the surface of the first semiconductor substrate on the light incident side in this order from the light incident side, forming the second width to be larger than the first width, and forming the groove in a region through which a through via connecting the second element and the first element penetrates.

Furthermore, in the solid-state imaging device manufacturing method of the fifth embodiment according to the present technology, the forming of the groove may be forming a second width and a first width that are substantially parallel to the surface of the first semiconductor substrate on the light incident side in this order from the light incident side, forming the second width to be larger than the first width, and forming the groove in an element separation region.

Moreover, in the solid-state imaging device manufacturing method of the fifth embodiment according to the present technology, the forming of the groove may be forming a second width and a first width that are substantially parallel to the surface of the first semiconductor substrate on the light incident side in this order from the light incident side, forming the second width to be larger than the first width, and forming the groove in a peripheral region outside a pixel region. In a case of forming the groove in the peripheral region outside the pixel region, the groove may be formed in a peripheral circuit region outside the pixel region, or may be formed in a scribe region (for example, a guard ring region).

Moreover, in the solid-state imaging device manufacturing method of the fifth embodiment according to the present technology, a bonding assisting film may be formed between the second insulating layer and the groove, and the forming of the groove may be forming a second width and a first width that are substantially parallel to the surface of the first semiconductor substrate on the light incident side in this order from the light incident side, forming the second width to be larger than the first width, and forming the groove in a region through which a through via connecting the second element and the first element penetrates, may be forming the groove in an element separation region, and may be forming the groove in a peripheral region outside a pixel region. In a case of forming the groove in the peripheral region outside the pixel region, the groove may be formed in a peripheral circuit region outside the pixel region, or may be formed in a scribe region (for example, a guard ring region).

According to the solid-state imaging device manufactured by the solid-state imaging device manufacturing method of the fifth embodiment according to the present technology, since a normal semiconductor substrate (bulk substrate) is used instead of using an SOI substrate, the manufacturing cost can be reduced, and further, it is possible to use the groove described above that acts as an end point detection function at the time of thinning to control the film thickness of the semiconductor substrate with high accuracy to improve the device characteristics.

Figure 6:
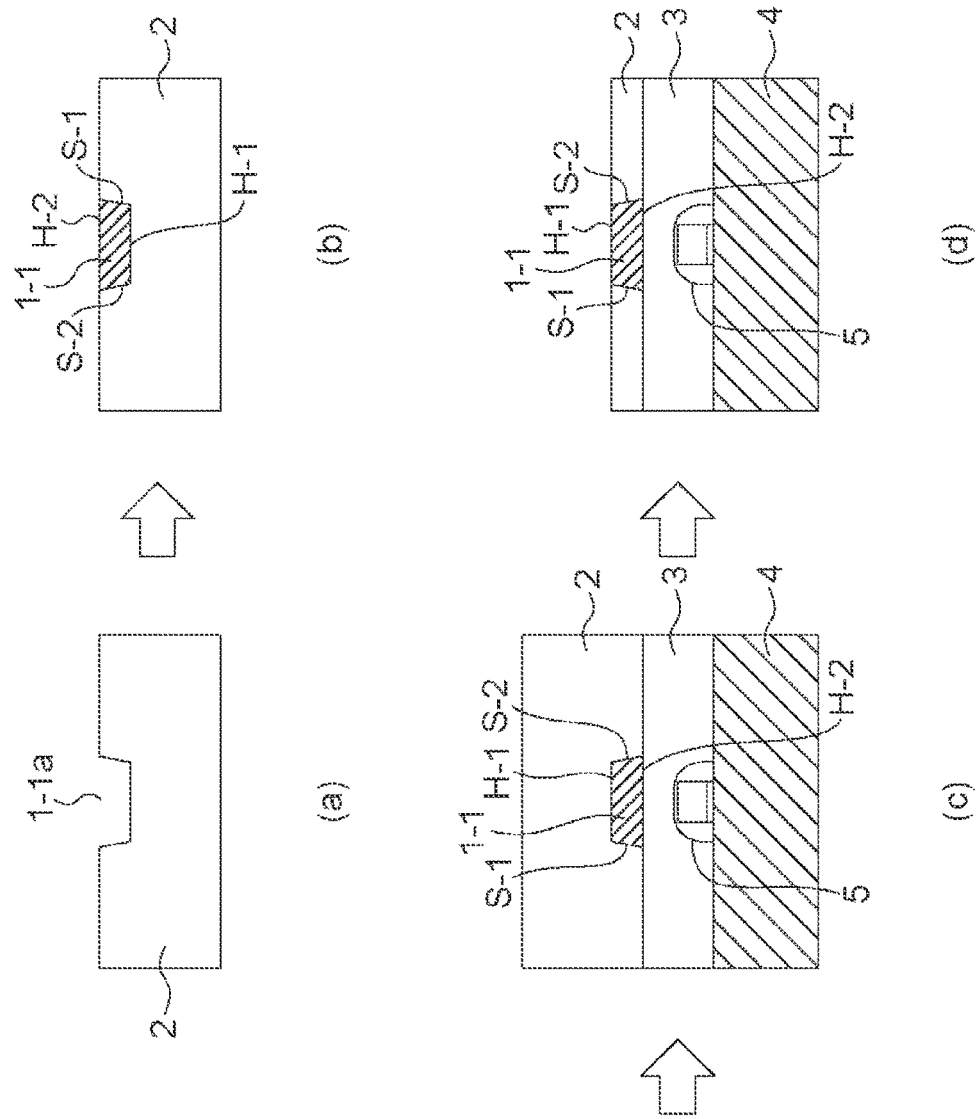
FIG. 6 is a cross-sectional view for explaining a solid-state imaging device manufacturing method to which the present technology is applied.

Hereinafter, the solid-state imaging device manufacturing method of the fifth embodiment according to the present technology will be described in more detail with reference to FIG. 6. FIG. 6 is a diagram for explaining a solid-state imaging device manufacturing method of the fifth embodiment according to the present technology, and specifically, FIGS. 6(a) to (d) are cross-sectional views for explaining the solid-state imaging device manufacturing method of fifth embodiment according to the present technology.

FIG. 6(a) is a diagram showing that a groove 1-1a (before embedding) is formed on the upper surface (upper side of FIG. 6(a)) of the first semiconductor substrate 2 (upper layer substrate). The groove 1-1a is manufactured by using lithography and dry etching.

As shown in FIG. 6(b), for example, an insulating material is embedded in the groove 1-1a, the upper surface (upper side of FIG. 6(b)) of the first semiconductor substrate 2 is flattened by CMP, and the embedded groove 1-1 is formed on the upper surface (upper side of FIG. 6(b)) of the first semiconductor substrate 2. The groove 1-1 has the left side wall S-2 (left side of FIG. 6(b)), the right side wall S-1 (right side of FIG. 6(a-2)), and further has the upper side H-2 (upper side of FIG. 6(b)), and the lower side H-1 (lower side of FIG. 6(b)). The groove 1-1 has a tapered shape in which the length of the upper side H-2 is longer than the length of the lower side H-1. The length of H-2 is a length in a direction substantially parallel to the upper surface of the first semiconductor substrate 2, and is a left-right length (width) in FIG. 6(b). As similar to this, the length of H-1 is also a length in a direction substantially parallel to the upper surface of the first semiconductor substrate 2, and is a left-right length (width) in FIG. 6(b). In addition, the left side wall S-2 and the right side wall S-1 extend in a lower direction (lower side of FIG. 6(b)) and in an oblique direction with respect to the upper surface of the first semiconductor substrate 2.

As shown in FIG. 6(c), the first semiconductor substrate 2 shown in FIG. 6(b) is rotated (turned over) by 180 degrees to bond the first semiconductor substrate 2 (upper layer substrate) and the second semiconductor substrate 4 (lower layer substrate) to each other via the second insulating layer 3 so that the surface of the first semiconductor substrate 2 on which the groove 1-1 has been formed and the surface of the second insulating layer 3 face each other. As shown in FIG. 6(c), since the first semiconductor substrate 2 is rotated (turned over) by 180 degrees as described above, the groove 1-1 has an inverted tapered shape. That is, the groove 1-1 has the left side wall S-1 (left side of FIG. 6(c)), the right side wall S-2 (right side of FIG. 6(c)), the upper side H-1 (upper side of FIG. 6(c)), and the lower side H-2 (lower side of FIG. 6(c)), and the length of the lower side H-2 is longer than the length of the upper side H-1.

As shown in FIG. 6(d), the first semiconductor substrate 2 (upper layer substrate) is removed until the groove 1-1 is exposed from the upper surface (upper side in FIG. 6(c)) of the first semiconductor substrate 2 (upper layer substrate) shown in FIG. 6(c) by using grinder, dry etching, CMP or the like, and the first semiconductor substrate 2 (upper layer substrate) is thinly processed. The groove 1-1 has an end point detection function for stopping the processing in thinning. By forming the groove 1-1 on the first semiconductor substrate 2 (upper layer substrate), the film thickness of the first semiconductor substrate 2 (upper layer substrate) can be controlled with high accuracy.

For example, the contents described in FIG. 2 can be applied as they are to the post-process of FIG. 6(d), and a solid-state imaging device is manufactured. In addition, the contents of the solid-state imaging device manufacturing method of the fifth embodiment according to the present technology described with reference to FIG. 6 are used for manufacturing the solid-state imaging device of the first to fourth embodiments according to the present technology.

7. Sixth Embodiment (Example of Electronic Device)

An electronic device of a sixth embodiment according to the present technology is an electronic device equipped with a solid-state imaging device, the solid-state imaging device according to the present technology including a second semiconductor substrate provided with a photoelectric conversion unit and a second element, a second insulating layer, a first semiconductor substrate provided with a first element, and a first insulating layer arranged in this order from a light incident side, and including a groove formed on a side of a surface of the first semiconductor substrate on the light incident side, in which the groove has a first side wall and a second side wall, and a part of at least one side wall of the first side wall or the second side wall extends in an oblique direction with respect to the surface of the first semiconductor substrate on the light incident side.

For example, the electronic device of the sixth embodiment according to the present technology is an electronic device equipped with the solid-state imaging device of any one of the first to fourth embodiments according to the present technology.

Figure 9:
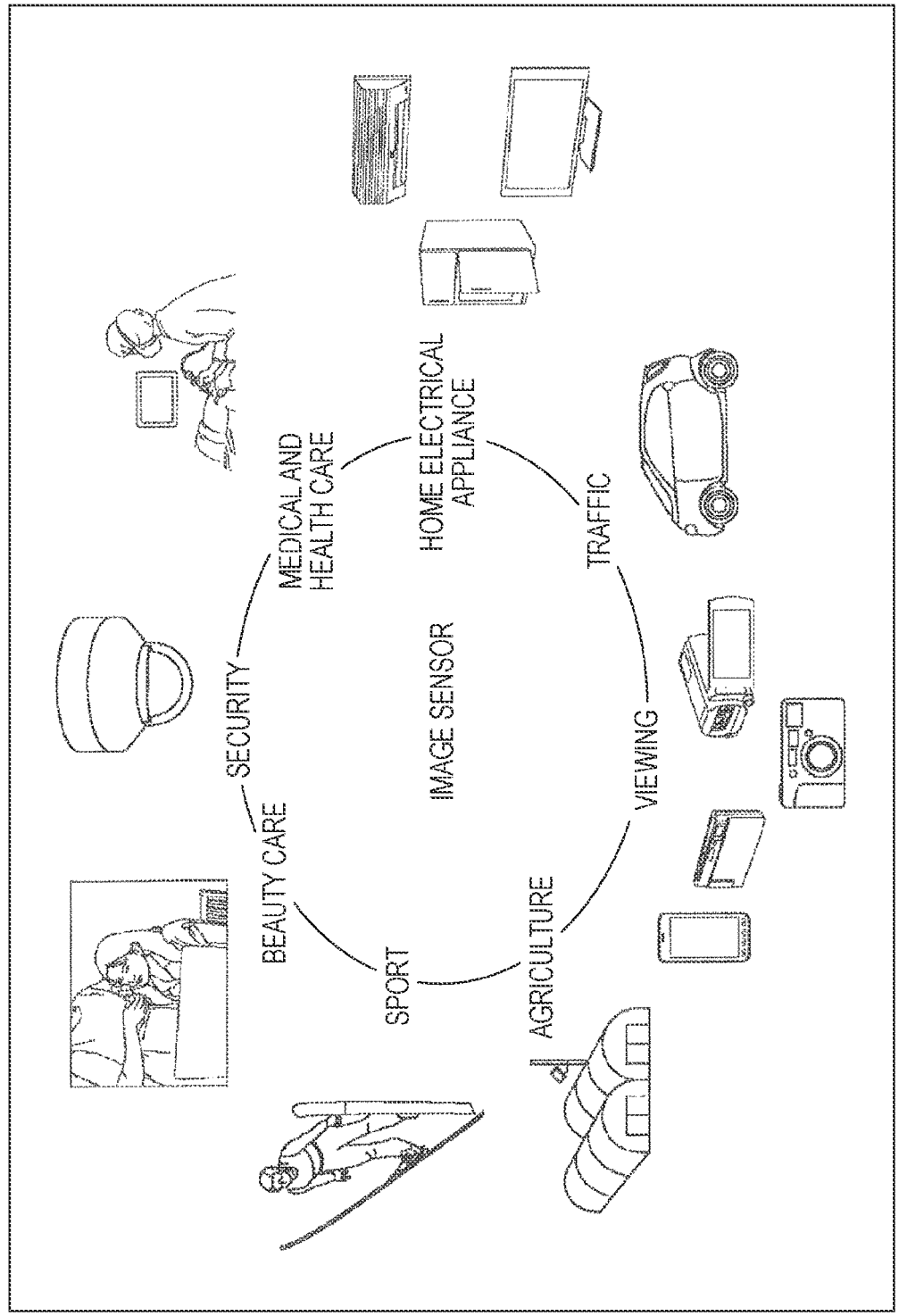
FIG. 9 is a diagram showing a use example of the solid-state imaging device of first to fourth embodiments to which the present technology is applied.

8. Use Example of Solid-State Imaging Device to which the Present Technology is Applied FIG. 9 is a diagram showing a use example of the solid-state imaging device of first to fourth embodiments to which the present technology is applied as an image sensor.

The above-described solid-state imaging device of the first to fourth embodiments can be used in various cases, for example, for sensing light such as visible light, infrared light, ultraviolet light, or X-rays, as described below. That is, as shown in FIG. 9, for example, the solid-state imaging device of any one of the first to fourth embodiments can be used in a device (for example, the above-described electronic device of the fifth embodiment) used in the field of viewing for capturing an image to be viewed, the field of traffic, the field of home electrical appliance, the field of medical and health care, the field of security, the field of beauty care, the field of sport, the field of agriculture, and the like.

Specifically, in the field of viewing, for example, the solid-state imaging device of any one of the first to fourth embodiments can be used in a device for capturing an image to be viewed, such as a digital camera, smartphone, or mobile phone with a camera function.

In the field of traffic, for example, the solid-state imaging device of any one of the first to fourth embodiments can be used in a device used for traffic purpose such as: an in-vehicle sensor for photographing the front, rear, surroundings, inside of a car, or the like of an automobile for safe driving such as automatic stop and recognition of driver's condition or the like; a surveillance camera for monitoring traveling vehicles and roads; and a distance measuring sensor that measures the distance between vehicles or the like.

In the field of home electrical appliance, for example, the solid-state imaging device of any of the first to fourth embodiments can be used in a device used as a home electrical appliance such as a television receiver, refrigerator, or air conditioner, for imaging a user's gesture so that the device is operated according to the gesture.

In the field of medical/health care, for example, the solid-state imaging device of any one of the first to fourth embodiments can be used in a device used for medical and health care, such as an endoscope or device that performs angiography by receiving infrared light.

In the field of security, for example, the solid-state imaging device of any one of the first to fourth embodiments can be used in a device used for security, such as a surveillance camera for crime prevention or a camera for personal authentication.

In the field of beauty care, for example, the solid-state imaging device of any one of the first to fourth embodiments can be used in a device used for beauty care, such as a skin measuring device for imaging the skin, or microscope for imaging the scalp.

In the field of sport, for example, the solid-state imaging device of any one of the first to fourth embodiments can be used in a device used for sport such as an action camera or wearable camera for sports applications and the like.

In the field of agriculture, for example, the solid-state imaging device of any one of the first to fourth embodiments can be used in a device used for agriculture, such as a camera for monitoring the state of fields and crops.

Figure 10:
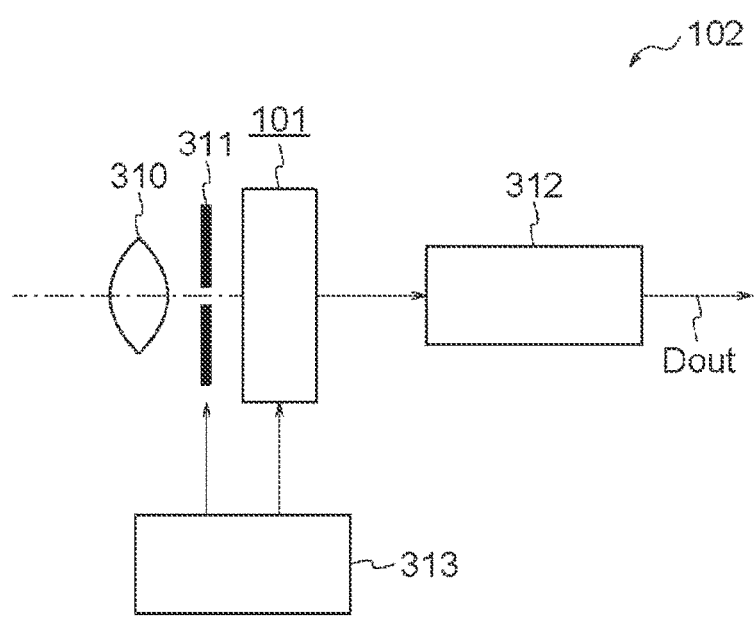
FIG. 10 is a functional block diagram of an example of an electronic device according to a sixth embodiment to which the present technology is applied.

Next, a use example of the solid-state imaging device of the first to fourth embodiments according to the present technology will be specifically described. For example, the solid-state imaging device of any one of the first to fourth embodiments described above can be applied as a solid-state imaging device 101, for example, to all types of electronic devices having an imaging function such as a camera system such as a digital still camera or a video camera, or mobile phones having an imaging function. FIG. 10 shows a schematic configuration of an electronic device 102 (camera) as an example. The electronic device 102 is, for example, a video camera capable of capturing a still image or a moving image, and includes a solid-state imaging device 101, an optical system (optical lens) 310, a shutter device 311, a drive unit 313 that drives the solid-state imaging device 101 and the shutter device 311, and a signal processing unit 312.

The optical system 310 guides image light (incident light) from a subject to a pixel unit 101a of the solid-state imaging device 101. The optical system 310 may include a plurality of optical lenses. The shutter device 311 controls a light irradiation period and a light shielding period for the solid-state imaging device 101. The drive unit 313 controls the transfer operation of the solid-state imaging device 101 and the shutter operation of the shutter device 311. The signal processing unit 312 performs various types of signal rocessing on the signal output from the solid-state imaging device 101. A video signal Dout after the signal processing is stored in a storage medium such as a memory or is output to a monitor or the like.

9. Application Example of Endocopic Surgery System

The present technology can be applied to various products. For example, the technology according to the present disclosure (present technology) may be applied to an endoscopic surgery system.

Figure 11:
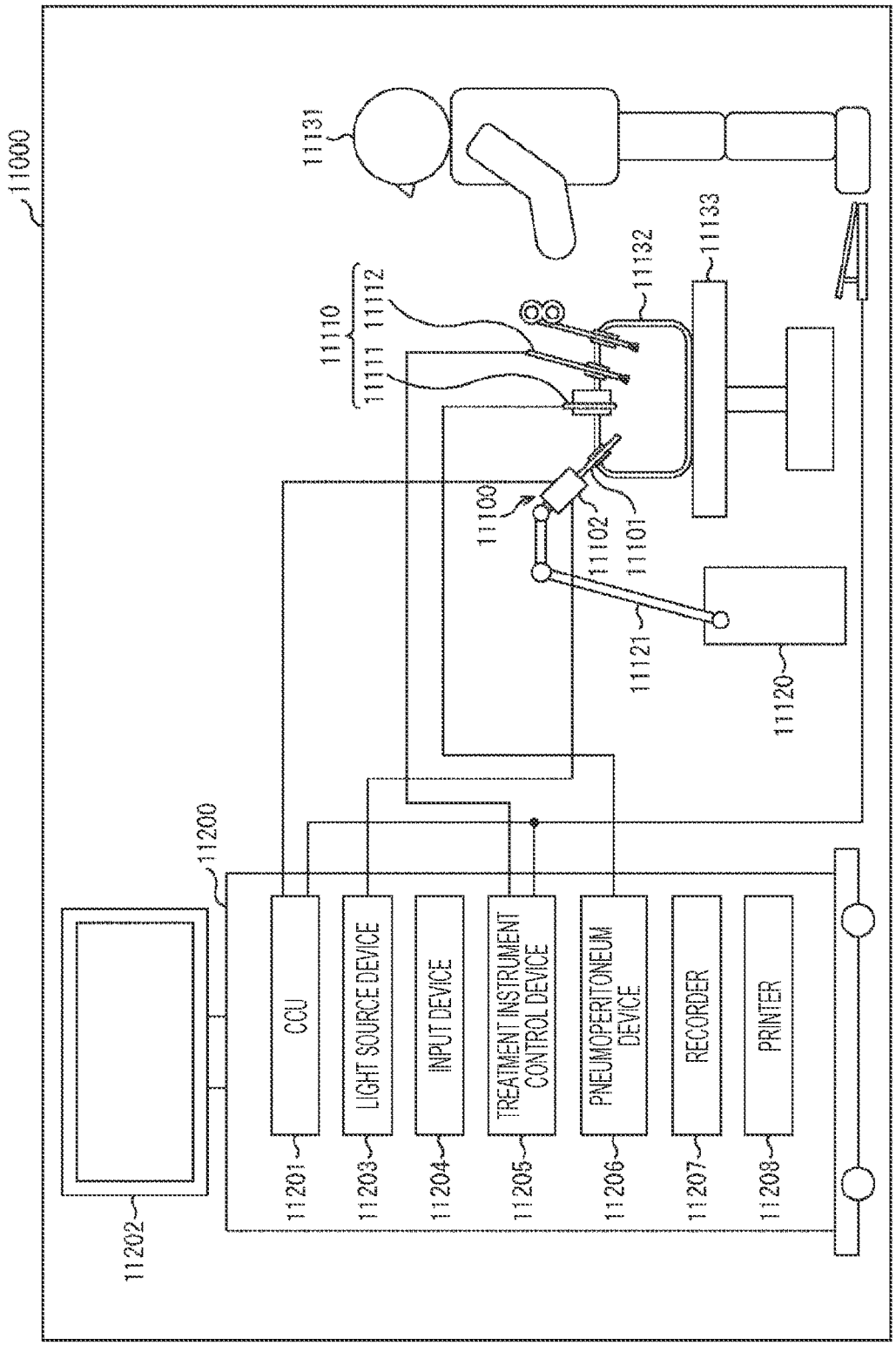
FIG. 11 is a diagram showing an example of a schematic configuration of an endoscopic surgery system.

FIG. 11 is a diagram showing an example of a schematic configuration of an endoscopic surgery system to which the technology (the present technology) according to the present disclosure can be applied.

FIG. 11 shows a situation where a surgeon (physician) 11131 performs surgery on a patient 11132 on a patient bed 11133 using an endoscopic surgery system 11000. As shown in the drawing, the endoscopic surgery system 11000 includes an endoscope 11100, other surgical tools 11110 such as a pneumoperitoneum tube 11111 and an energy treatment instrument 11112, a support arm device 11120 that supports the endoscope 11100, and a cart 11200 on which various devices for endoscopic surgery are mounted.

The endoscope 11100 includes a lens barrel 11101 in which a region of a predetermined length from the distal end is inserted into the body cavity of the patient 11132, and a camera head 11102 connected to the proximal end of the lens barrel 11101. In the illustrated example, the endoscope 11100 formed as a so-called rigid mirror having a rigid lens barrel 11101 is illustrated. However, the endoscope 11100 may be formed as a so-called flexible mirror having a flexible lens barrel.

At the tip of the lens barrel 11101, an opening portion into which an objective lens is fitted is provided. The light source device 11203 is connected to the endoscope 11100 and light generated by the light source device 11203 is guided to the distal end of the lens barrel by a light guide extending inside the lens barrel 11101, and is emitted toward the observation target in the body cavity of the patient 11132 via the objective lens. Note that the endoscope 11100 may be a forward-viewing endoscope, or may be an oblique-viewing endoscope or a side-viewing endoscope.

An optical system and an imaging element are provided inside the camera head 11102, and reflected light (observation light) from the observation target is collected to the imaging element by the optical system. The observation light is photoelectrically converted by the imaging element, and an electrical signal corresponding to the observation light, that is, an image signal corresponding to the observation image is generated. The image signal is transmitted as RAW data to a camera control unit (CCU) 11201.

The CCU 11201 includes a central processing unit (CPU) or graphics processing unit (GPU), or the like, and centrally controls operation of the endoscope 11100 and the display device 11202. Moreover, the CCU 11201 receives an image signal from the camera head 11102, and performs various image processing for display of the image based on the image signal, such as, development processing (demosaic processing), for example, for the image signal.

The display device 11202 displays the image based on the image signal subjected to image processing by the CCU 11201 under the control of the CCU 11201.

The light source device 11203 includes a light source such as a light emitting diode (LED), for example, and supplies irradiation light to the endoscope 11100 in photographing a surgical site or the like.

The input device 11204 is an input interface to the endoscopic surgery system 11000. The user can input various kinds of information and input instructions to the endoscopic surgery system 11000 via the input device 11204. For example, the user inputs an instruction or the like to change imaging conditions by the endoscope 11100 (kind of irradiation light, magnification, focal length, or the like).

The treatment instrument control device 11205 controls driving of the energy treatment instrument 11112 for cauterizing tissue, cutting incisions, sealing blood vessels, or the like. The pneumoperitoneum device 11206 feeds gas into the body cavity of the patient 11132 via the pneumoperitoneum tube 11111 to inflate the body cavity for the purpose of securing a visual field by the endoscope 11100 and securing a working space of the surgeon. The recorder 11207 is a device capable of recording various kinds of information associated with surgery. The printer 11208 is a device capable of printing various kinds of information associated with surgery in various formats such as text, image, and graph.

Note that the light source device 11203 that supplies irradiation light in photographing of a surgical site to the endoscope 11100 can include, for example, a white light source including an LED, a laser light source, or a combination thereof. In a case where the white light source is configured by the combination of the RGB laser light sources, since the output intensity and the output timing of each color (each wavelength) can be controlled with high accuracy, adjustment of the white balance of the captured image by the light source device 11203 can be performed. Furthermore, in this case, the laser light from each of the RGB laser light sources is emitted to the observation target in time division and driving of the imaging element of the camera head 11102 is controlled in synchronization with the emission timing, so that it is possible to image images corresponding to each of RGB in time division. According to this method, a color image can be obtained without providing a color filter in the imaging element.

Furthermore, the light source device 11203 may be controlled to change the intensity of light to be output at predetermined time intervals. The driving of the imaging element of the camera head 11102 is controlled in synchronization with the timing of the change of the intensity of the light, images are obtained in time division, and the images are combined, so that it is possible to generate a high dynamic image in which so-called halation and black defects do not exist.

Furthermore, the light source device 11203 may be configured to be capable of supplying light of a predetermined wavelength band corresponding to special light observation. In the special light observation, for example, the wavelength dependence of light absorption in the body tissue is utilized, and narrow band light compared with irradiation light at the time of ordinary observation (in other words, white light) is emitted, so that photographing a predetermined tissue such as a blood vessel in the mucosal surface layer with high contrast, so-called narrow band imaging, is performed. Alternatively, in the special light observation, fluorescence observation for obtaining an image by fluorescence generated by emitting excitation light may be performed. In the fluorescence observation, it is possible to irradiate a body tissue with excitation light to observe the fluorescence from the body tissue (autofluorescence observation), or to inject a reagent such as indocyanine green (ICG) to the body tissue and irradiate the body tissue with excitation light corresponding to the fluorescence wavelength of the reagent to obtain a fluorescent image, for example. The light source device 11203 can be configured to be able to supply narrowband light and/or excitation light corresponding to such special light observation.

Figure 12:
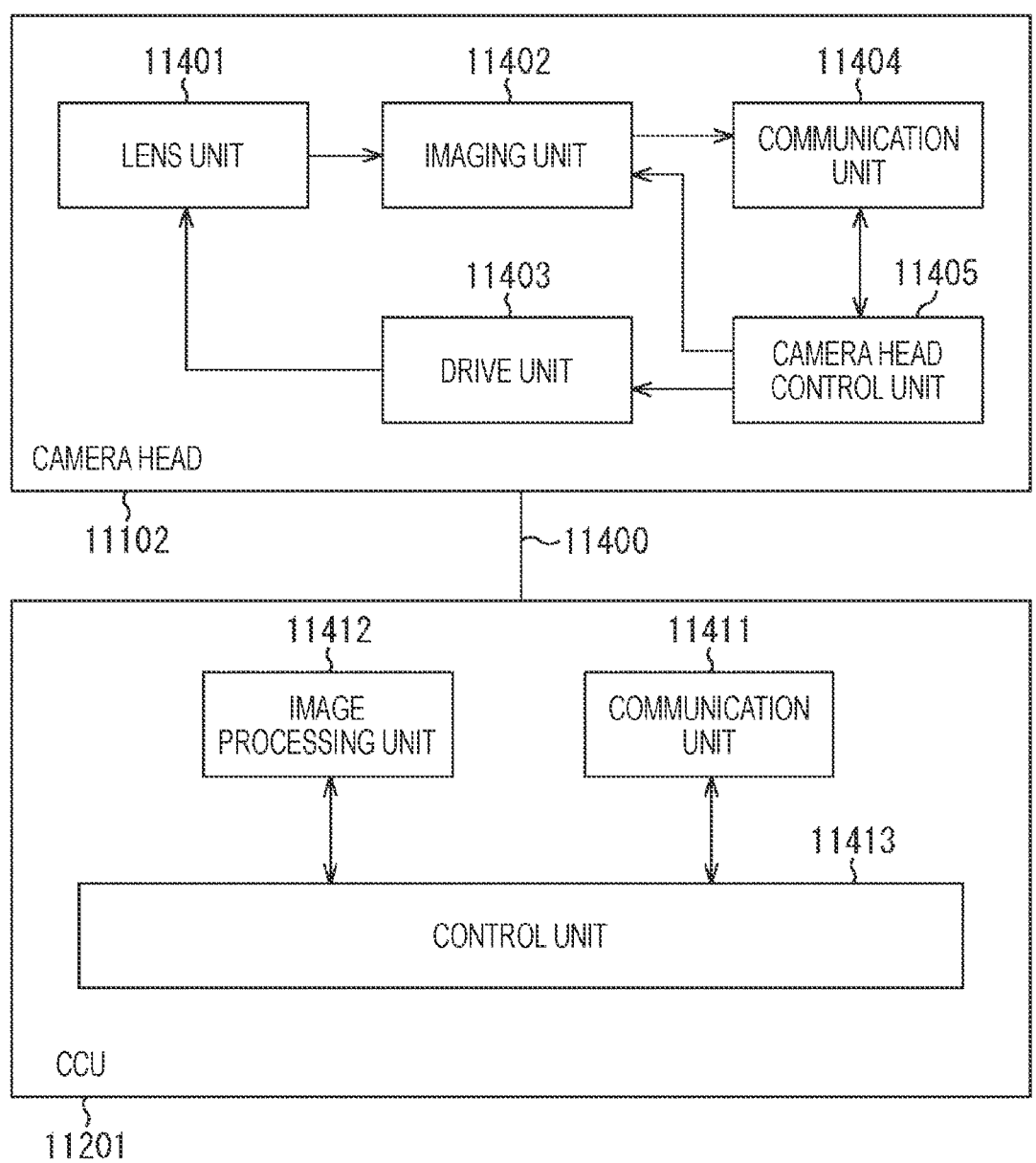
FIG. 12 is a block diagram showing an example of a functional configuration of a camera head and a CCU.

FIG. 12 is a block diagram showing an example of a functional configuration of the camera head 11102 and the CCU 11201 shown in FIG. 11.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connecting portion with the lens barrel 11101. The observation light taken in from the distal end of the lens barrel 11101 is guided to the camera head 11102 and is incident on the lens unit 11401. The lens unit 11401 is configured by combining a plurality of lenses including a zoom lens and a focus lens.

The imaging unit 11402 includes an imaging element. The imaging element included in the imaging unit 11402 may be one (so-called single plate type) or plural (so-called multiple plate type). In the case where the imaging unit 11402 is formed in a multiple plate type, for example, image signals corresponding to each of R, G, and B may be generated by each imaging element, and the signals may be combined so that a color image is obtained. Alternatively, the imaging unit 11402 may have a pair of imaging elements for acquiring right-eye and left-eye image signals corresponding to 3 dimensional (3D) display, respectively. By the 3D display, the surgeon 11131 can grasp the depth of a living tissue in the surgical site more accurately. Note that, in a case where the imaging unit 11402 is formed in a multiple plate type, a plurality of lens units 11401 can be provided corresponding to each imaging element.

Furthermore, the imaging unit 11402 is not necessarily provided in the camera head 11102. For example, the imaging unit 11402 may be provided inside the lens barrel 11101 immediately after the objective lens.

The drive unit 11403 includes an actuator and moves the zoom lens and the focus lens of the lens unit 11401 by a predetermined distance along the optical axis under the control of the camera head control unit 11405. As a result, the magnification and the focus of the captured image by the imaging unit 11402 can be appropriately adjusted.

The communication unit 11404 includes a communication device for transmitting and receiving various kinds of information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling driving of the camera head 11102 from the CCU 11201, and supplies the control signal to the camera head control unit 11405. The control signal may include, for example, information associated with imaging conditions such as information that a frame rate of the captured image is designated, information that an exposure value at the time of imaging is designated, and/or information that the magnification and focus of the captured image are designated.

Note that the imaging conditions such as the frame rate, the exposure value, the magnification, and the focus may be appropriately specified by a user, or may be automatically set by the control unit 11413 of the CCU 11201 on the basis of the acquired image signal. In the latter case, the so-called auto exposure (AE) function, the auto focus (AF) function, and the auto white balance (AWB) function are installed in the endoscope 11100.

The camera head control unit 11405 controls driving of the camera head 11102 on the basis of the control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

Furthermore, the communication unit 11411 transmits a control signal for controlling driving of the camera head 11102 to the camera head 11102. The image signal and the control signal can be transmitted by electric communication, optical communication, or the like.

The image processing unit 11412 performs various image processing on the image signal which is RAW data transmitted from the camera head 11102.

The control unit 11413 performs various control relating to imaging of a surgical site or the like by the endoscope 11100, and display of captured images obtained by imaging of a surgical site or the like. For example, the control unit 11413 generates a control signal for controlling driving of the camera head 11102.

Furthermore, the control unit 11413 causes the display device 11202 to display the captured image including a surgical site or the like on the basis of the image signal subjected to the image processing by the image processing unit 11412. In this case, the control unit 11413 may recognize various objects in the captured image using various image recognition techniques. For example, the control unit 11413 can recognize a surgical tool such as a forceps, a specific body part, bleeding, a mist at the time of using the energy treatment instrument 11112, or the like by detecting the shape, color, or the like of the edge of the object included in the captured image. When causing the display device 11202 to display the captured image, the control unit 11413 may cause various surgical operation support information to be superimposed and displayed on the image of the surgical site using the recognition result. The surgical operation support information is superimposed and displayed, and presented to the surgeon 11131, so that the burden on the surgeon 11131 can be reduced and the surgeon 11131 can reliably proceed with surgery.

The transmission cable 11400 connecting the camera head 11102 and the CCU 11201 is an electric signal cable corresponding to communication of electric signals, an optical fiber corresponding to optical communication, or a composite cable thereof.

Here, in the example shown in the drawing, communication is performed by wire using the transmission cable 11400. However, communication between the camera head 11102 and the CCU 11201 may be performed wirelessly.

An example of the endoscopic surgery system to which the technology according to the present disclosure can be applied has been described above. The technology according to the present disclosure can be applied to the endoscope 11100, (the imaging unit 11402 of) the camera head 11102 and the like in the above-described configuration. Specifically, the solid-state imaging device 111 of the present disclosure can be applied to the imaging unit 10402. By applying the technology according to the present disclosure to the endoscope 11100, (the imaging unit 11402 of) the camera head 11102, and the like, it is possible to further improve the reliability of the endoscope 11100, (imaging unit 11402 of) the camera head 11102, and the like, and moreover, improve the yield and reduce the manufacturing cost.

Although an endoscopic surgery system has been described as an example here, the technology according to the present disclosure may also be applied to, for example, a microscopic surgery system or the like.

Note that the present technology is not limited to the above-described embodiments, use examples, and application examples, and various modifications are possible without departing from the gist of the present technology.

Furthermore, the effects described in the present specification are merely examples and are not intended to be limiting, and other effects may be provided.

Furthermore, the present technology can adopt the following configuration.

[1]

A solid-state imaging device including
a second semiconductor substrate provided with a photoelectric conversion unit and a second element, a second insulating layer, a first semiconductor substrate provided with a first element, and a first insulating layer arranged in this order from a light incident side, and
including a groove formed on the first semiconductor substrate,
in which the groove has a first side wall and a second side wall, and a part of at least one side wall of the first side wall or the second side wall extends in an oblique direction with respect to a surface of the first semiconductor substrate on the light incident side.

[2]

The solid-state imaging device according to [1], in which the groove is embedded with an insulating material.

[3]

The solid-state imaging device according to [1] or [2], in which the groove has a second width and a first width that are substantially parallel to the surface of the first semiconductor substrate on the light incident side in order from the light incident side, and
the second width is larger than the first width.

[4]

The solid-state imaging device according to any one of [1] to [3], in which the groove is formed in a region through which a through via connecting the second element and the first element penetrates.

[5]

The solid-state imaging device according to any one of [1] to [4], in which the groove is formed in an element separation region.

[6]

The solid-state imaging device according to any one of [1] to [5], in which the groove is formed in a peripheral region outside a pixel region.

[7]

The solid-state imaging device according to any one of [1] to [6], in which the groove is formed in a scribe region.

[8]

The solid-state imaging device according to any one of [1] to [7], further including a bonding assisting film,
in which the bonding assisting film is arranged between the second insulating layer and the groove.

[9]

A solid-state imaging device manufacturing method including:
 forming a groove on one surface of a first semiconductor substrate;
 stacking a second semiconductor substrate, a second insulating layer, the first semiconductor substrate, and a first insulating layer in this order so that the one surface of the first semiconductor substrate and the second insulating layer face each other; and
 removing the first semiconductor substrate until the groove is exposed from another surface of the first semiconductor substrate on a side opposite to the one surface of the first semiconductor substrate,
 in which the forming of the groove is forming so that the groove forms a first side wall and a second side wall and a part of at least one side wall of the first side wall or the second side wall extends in an oblique direction with respect to the one surface of the first semiconductor substrate.

[10]

The solid-state imaging device manufacturing method according to [9], further including embedding an insulating material in the groove
before the stacking.

[11]

The solid-state imaging device manufacturing method according to [9] or [10], in which the groove has a second width and a first width that are substantially parallel to the surface of the first semiconductor substrate on the light incident side in order from the light incident side, and
the second width is larger than the first width.

[12]

The solid-state imaging device manufacturing method according to any one of [9] to [11], further including forming the groove in a region through which a through via connecting the second element and the first element penetrates.

[13]

The solid-state imaging device manufacturing method according to any one of [9] to [12], further including forming the groove in an element separation region.

[14]

The solid-state imaging device manufacturing method according to any one of [9] to [13], further including forming the groove in a peripheral region outside a pixel region.

[15]

The solid-state imaging device manufacturing method according to any one of [9] to [14], further including forming the groove in a scribe region.

[16]

The solid-state imaging device manufacturing method according to any one of [9] to [15], further including forming a bonding assisting film between the second insulating layer and the groove.

[17]

An electronic device equipped with a solid-state imaging device,
 the solid-state imaging device including
 a second semiconductor substrate provided with a photoelectric conversion unit and a second element, a second insulating layer, a first semiconductor substrate provided with a first element, and a first insulating layer arranged in this order from a light incident side, and
 including a groove formed on a side of a surface of the first semiconductor substrate on the light incident side, in which the groove has a first side wall and a second side wall, and a part of at least one side wall of the first side wall or the second side wall extends in an oblique direction with respect to the surface of the first semiconductor substrate on the light incident side.

[18]

An electronic device equipped with the solid-state imaging device according to any one of [1] to [8].

REFERENCE SIGNS LIST

1(1-1, 1-1a, 1-2, 1-3, 1-4, 1-5) Groove
2 First semiconductor substrate (upper layer substrate)
3 Second insulating layer
4 Second semiconductor substrate (lower layer substrate)
5 First element
6 First insulating layer
7 Second element
8 Through via
50 Bonding assisting film
2000, 3000-a, 3000-b, 4000-a, 4000-b, 5000, 8000 Solid-state imaging device
S-1 Left side wall
S-2 Right side wall
H-1 Upper side
H-2 Lower side

What is claimed is:

1. A solid-state imaging device manufacturing method, comprising:
 forming a groove on one surface of a first semiconductor substrate;
 stacking a second semiconductor substrate, a second insulating layer, the first semiconductor substrate, and a first insulating layer in this order so that the one surface of the first semiconductor substrate and the second insulating layer face each other; and
 removing the first semiconductor substrate until the groove is exposed from another surface of the first semiconductor substrate on a side opposite to the one surface of the first semiconductor substrate,
 wherein the groove forms a first side wall and a second side wall, and wherein a part of at least one of the first side wall or the second side wall extends in an oblique direction with respect to the one surface of the first semiconductor substrate.

2. The solid-state imaging device manufacturing method according to claim 1, further comprising embedding an insulating material in the groove before the stacking.

3. The solid-state imaging device manufacturing method according to claim 1, wherein the groove has a second width and a first width that are substantially parallel to the surface of the first semiconductor substrate on a light incident side in order from the light incident side, and wherein the second width is larger than the first width.

4. The solid-state imaging device manufacturing method according to claim 1, wherein the second semiconductor substrate is provided with a second element, wherein the first semiconductor substrate is provided with a first element, and wherein the groove is formed in a region through which a through via connecting the second element and the first element penetrates.

5. The solid-state imaging device manufacturing method according to claim 1, wherein the groove is formed in an element separation region.

6. The solid-state imaging device manufacturing method according to claim 1, wherein the groove is formed in a peripheral region outside a pixel region.

7. The solid-state imaging device manufacturing method according to claim 1, wherein the groove is formed in a scribe region.

8. The solid-state imaging device manufacturing method according to claim 1, wherein a bonding assisting film is arranged between the second insulating layer and the groove.

\* \* \* \* \*